(12) United States Patent
Deacon

(10) Patent No.: US 6,243,517 B1
(45) Date of Patent: Jun. 5, 2001

(54) CHANNEL-SWITCHED CROSS-CONNECT

(75) Inventor: David A. G. Deacon, Los Altos, CA (US)

(73) Assignee: Sparkolor Corporation, Santa Clara, CA (US)

( * ) Notice: Subject to any disclaimer, the term of this patent is extended or adjusted under 35 U.S.C. 154(b) by 0 days.

(21) Appl. No.: 09/434,709

(22) Filed: Nov. 4, 1999

(51) Int. Cl.$^7$ .............................. G02B 6/26; H01S 3/083
(52) U.S. Cl. .............................. 385/50; 385/14; 385/24; 385/37; 385/50; 385/129; 372/20; 372/92; 372/94; 372/102
(58) Field of Search .............................. 385/14, 24, 37, 385/50, 129; 372/94, 20, 102, 50; 359/124, 127, 130

(56) References Cited

U.S. PATENT DOCUMENTS

| | | | |
|---|---|---|---|
| 4,582,390 | 4/1986 | Furuya | 350/96.12 |
| 4,592,043 * | 5/1986 | Williams | 370/3 |
| 4,737,007 | 4/1988 | Alferness et al. | 350/96.19 |
| 4,786,132 | 11/1988 | Gordon | 350/96.19 |
| 4,955,028 | 9/1990 | Alferness et al. | 372/20 |
| 5,042,898 | 8/1991 | Morey et al. | 385/37 |
| 5,134,620 | 7/1992 | Huber | 372/6 |
| 5,317,576 | 5/1994 | Leonberger et al. | 372/6 |
| 5,418,802 | 5/1995 | Chwalck | 372/20 |
| 5,459,801 | 10/1995 | Snitzer | 385/30 |
| 5,504,772 * | 4/1996 | Deacon et al. | 372/102 |
| 5,581,642 * | 12/1996 | Deacon et al. | 385/15 |
| 5,732,102 | 3/1998 | Bouadma | 372/96 |
| 5,857,039 | 1/1999 | Bosc et al. | 385/14 |
| 5,870,417 | 2/1999 | Verdiell et al. | 372/32 |
| 5,875,272 * | 2/1999 | Kewitsch et al. | 385/37 |

OTHER PUBLICATIONS

Y. Kokubun et al., "Athermal Waveguides for Temperature–Independent Lightwave Devices", Nov. 1993, IEEE Photonics Tech. Letters, vol. 5, pp. 1297–1300.*
Y. Kokubun et al., "Temperature–Independent Optical Filter at 1.55 um Wavelength Using a Silica–Based Athermal Waveguide", 1998, Proceedings of the Intergrated Photonics Research Conf.*
K. Tada et al., "Temperature Compensated Coupled Cavity Diode Lasers", *Optical and Quantum Elec.*, vol. 16, 1984, pp. 463–469.
J.M. Hammer et al., "Single–Wavelength Operation nof the Hybrid–External Bragg–Reflector–Waveguide Laser Under Dynamic Conditions", *Appl. Phys. Lett.* 47, Aug. 1985, pp. 183–185.
E. Brinkmeyer et al., "Fibre Bragg Reflector for Mode Selection and Line–Narrowing of Injection Lasers", *Elec. Letters*, vol. 22, No. 3, Jan. 30, 1986, pp. 134–135.
D.M. Bird, "Narrow Line Semiconductor Laser Using Fibre Grating", *Elec. Letters*, vol. 27, No. 13, Jun. 20, 1991, pp. 1115–1116.

(List continued on next page.)

Primary Examiner—Hemang Sanghavi
Assistant Examiner—Omar Rojas
(74) Attorney, Agent, or Firm—Thomas Schneck; Mark Protsik

(57) ABSTRACT

The different embodiments of the invention include tunable add-drop and cross connect devices. The add-drop and cross connect devices include materials with negative dependence of refractive index on temperature and temperature independent coincidence between resonator modes and a set of specified frequencies, e.g. for DWDM telecommunications channels. The free spectral range may be adjusted to equal a rational fraction of the specified frequency interval. The operating frequency may be selected without substantially tuning the cavity modes. This can be accomplished by means of a waveguide pair with differential thermal response.

27 Claims, 14 Drawing Sheets

OTHER PUBLICATIONS

Y. Kokubun et al., "Athermal Waveguides for Temperature-Independent Lightwave Devices", *IEEE Photonics Tech. Letters*, vol. 5, No. 11, Nov. 1993, pp. 1297–1300.

P.A. Morton et al., "Stable Single Mode Hybrid Laser with High Power and Narrow Linewidth", *Appl. Phys. Lett.* 64, May 16, 1994, pp. 2634–2636.

R.J. Campbell, "Wavelength Stable Uncooled Fibre Grating Semiconductor Laser for Use in an All Optical WDM Access Network", *Elec. Lett.*, vol. 32, No. 2, Jan. 18, 1996 pp. 119–120.

T. Tanaka et al., "Integrated External Cavity Laser Composed of Spot–Size Converted LD and UV Written Grating in Silica Waveguide on Si", *Elec. Lett.* 32, 13, Jun. 20, 1996, pp. 1202.

D. Bosc et al., "Temperature and Polarisation Insensitive Bragg Gratings Realised on Silica Waveguide on Silicon", *Elec. Lett.*, vol. 33, No. 2, Jan. 16, 1997, pp. 134–136.

Y. Kokubun et al. "Temperature–Independent Optical Filter at 1.55/$\mu$m Wavelength Using a Silica–Based Athermal Waveguide", Proceedings of the Integrated Photonics Research Conf., 1998.

L. Eldada et al., "Thermally Tunable Polymer Bragg Grating OADM's", Proceedings of the Optical Fiber Communications Conf., Optical Society of America, 1999, pp. 98–100.

B. Ortega et al., "Wavelength Division Multiplexing All–Fiber Hybrid Devices Based on Fabry–Perot's and Gratings", *Journal of Lightwave Technology*, vol. 17, No. 7, Jul. 1999, p. 1241.

\* cited by examiner

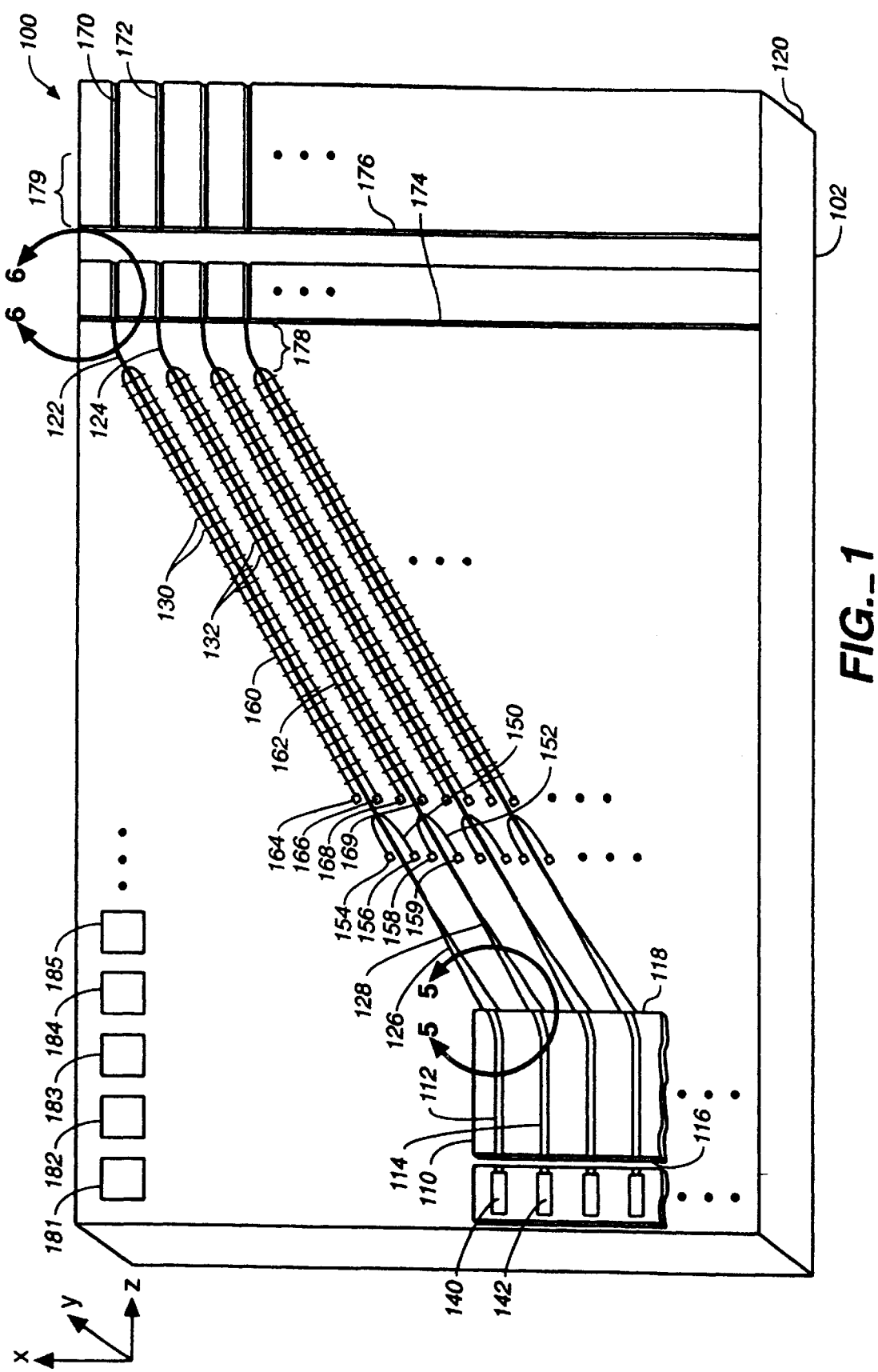
FIG._1

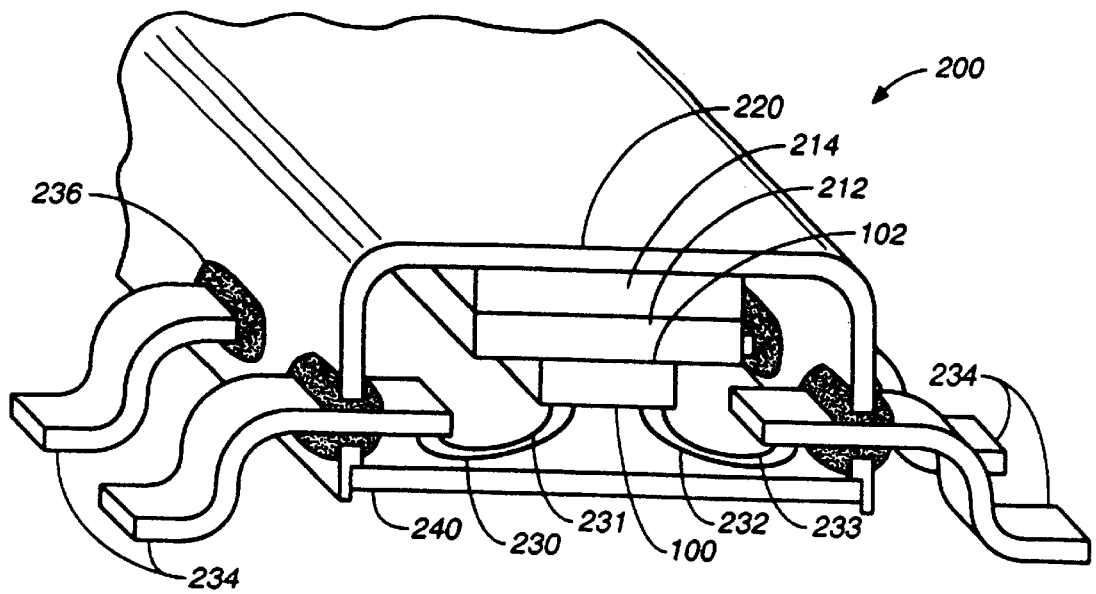
FIG._2
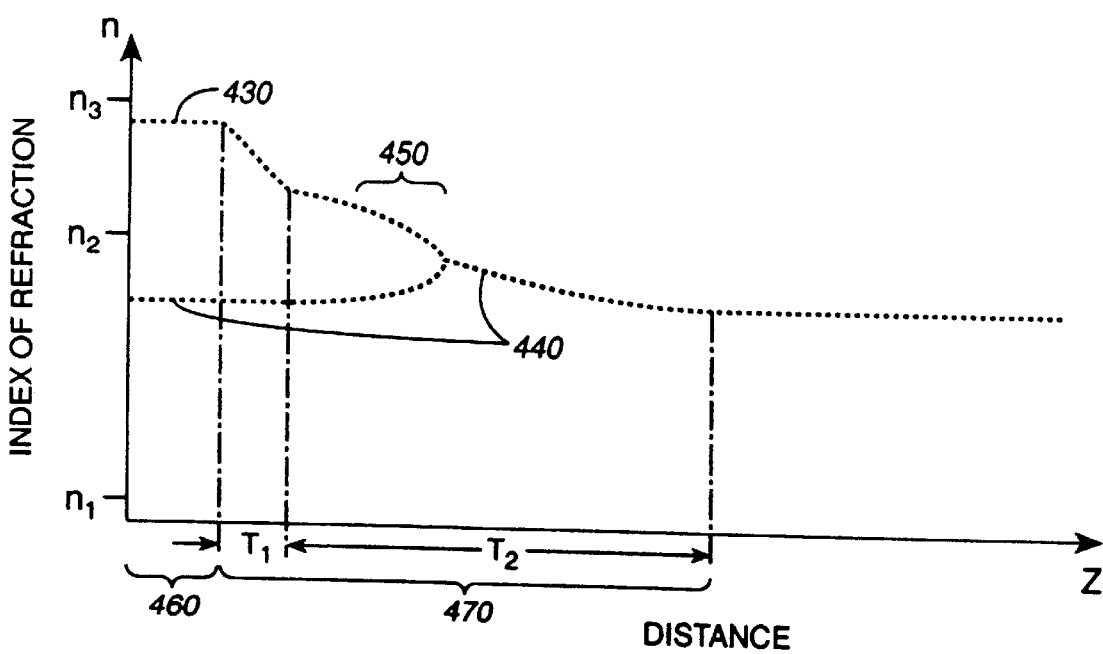
FIG._4

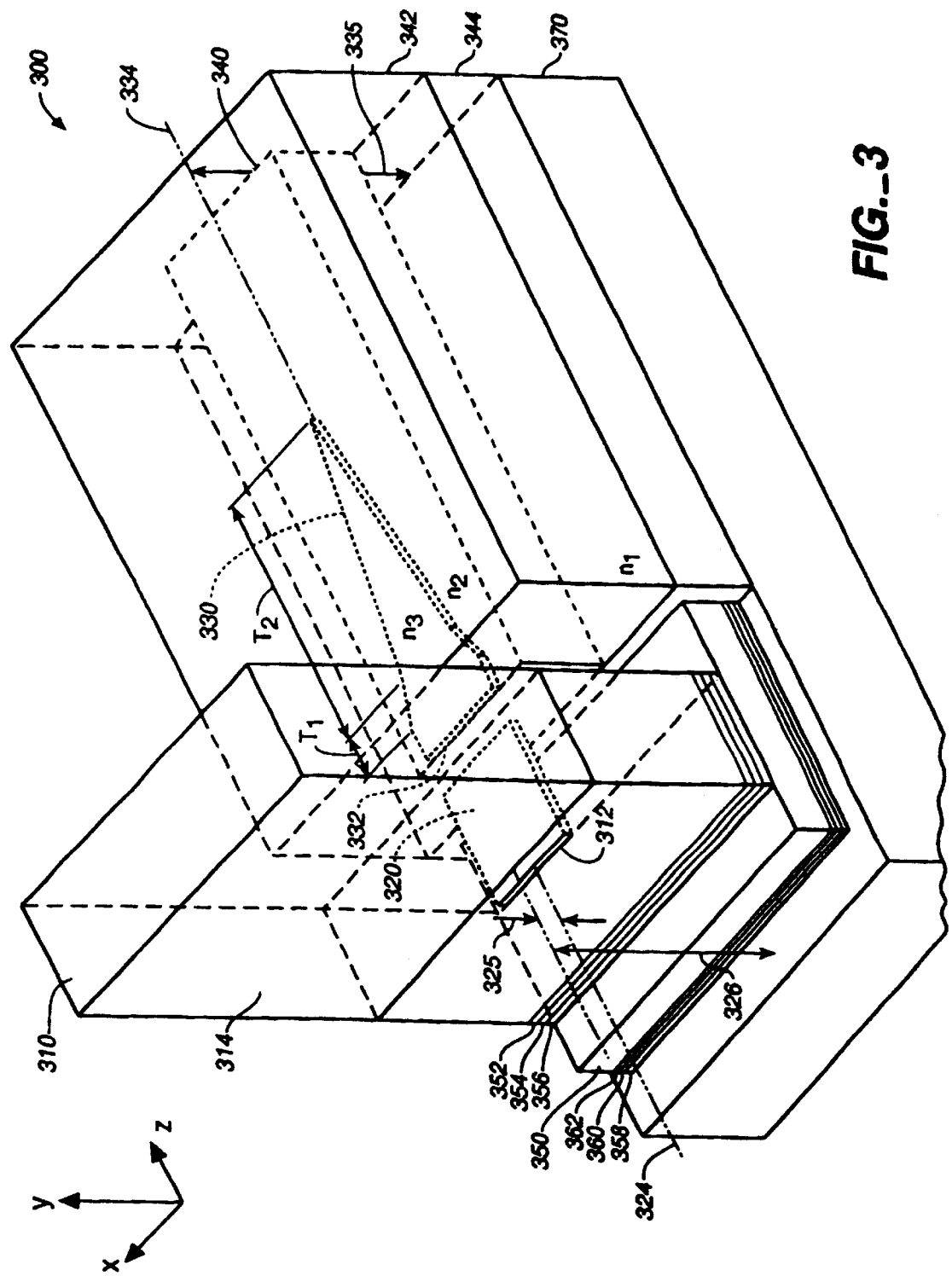
FIG._3

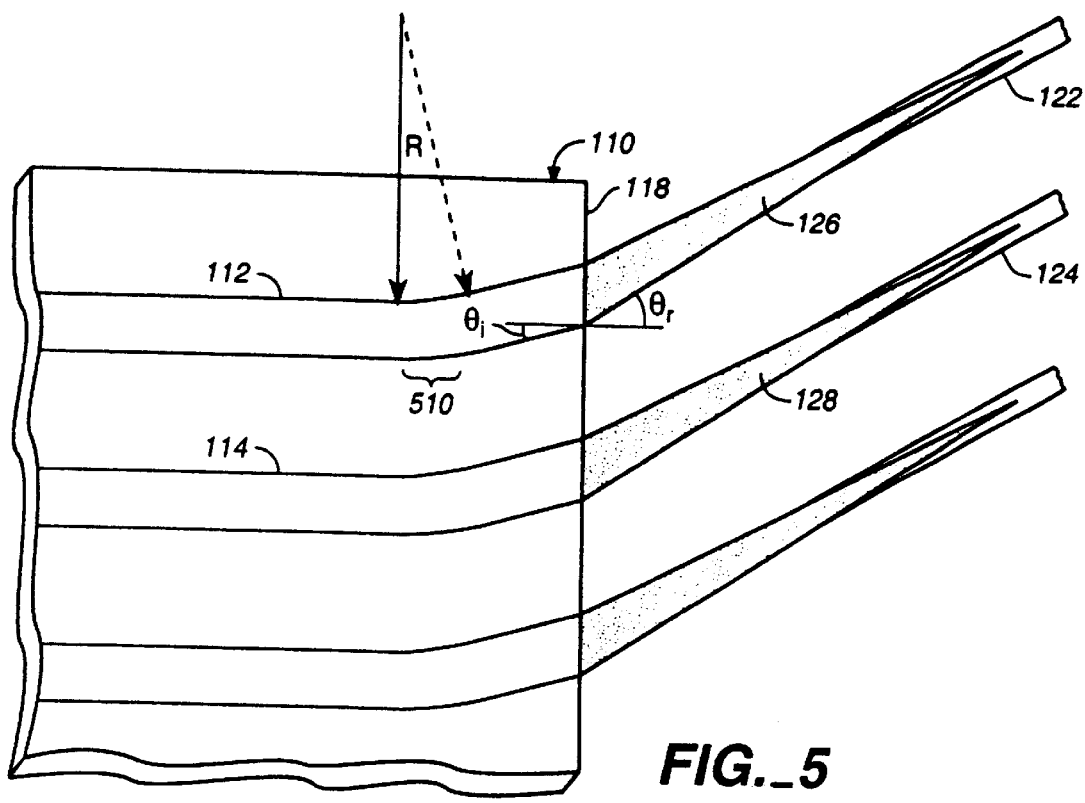
FIG._5
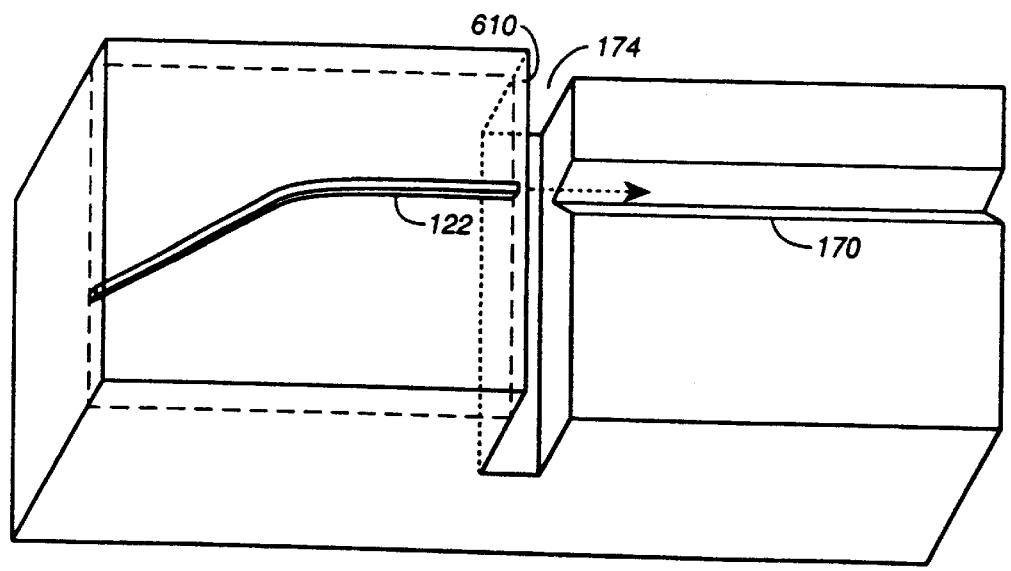
FIG._6

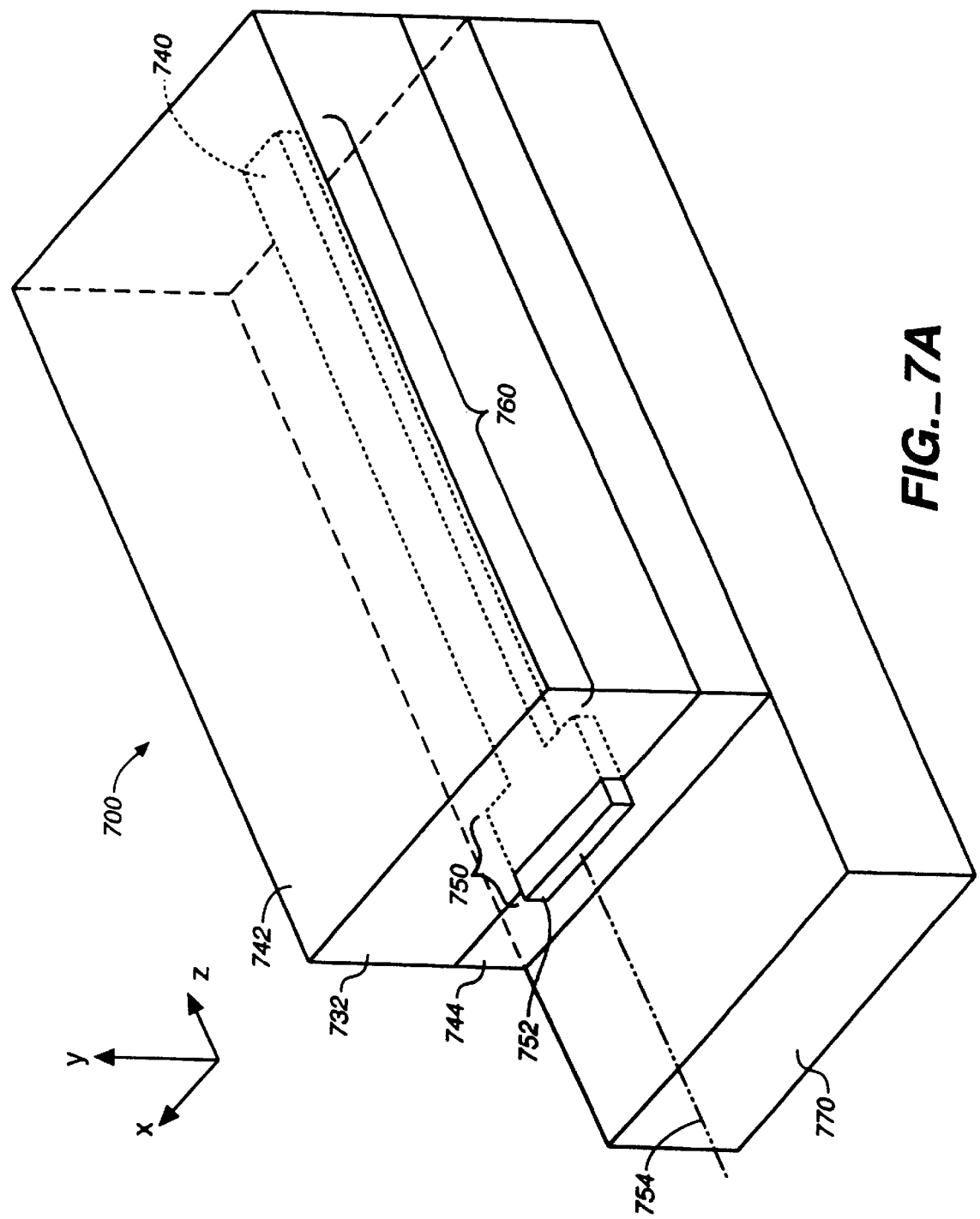
FIG._7A

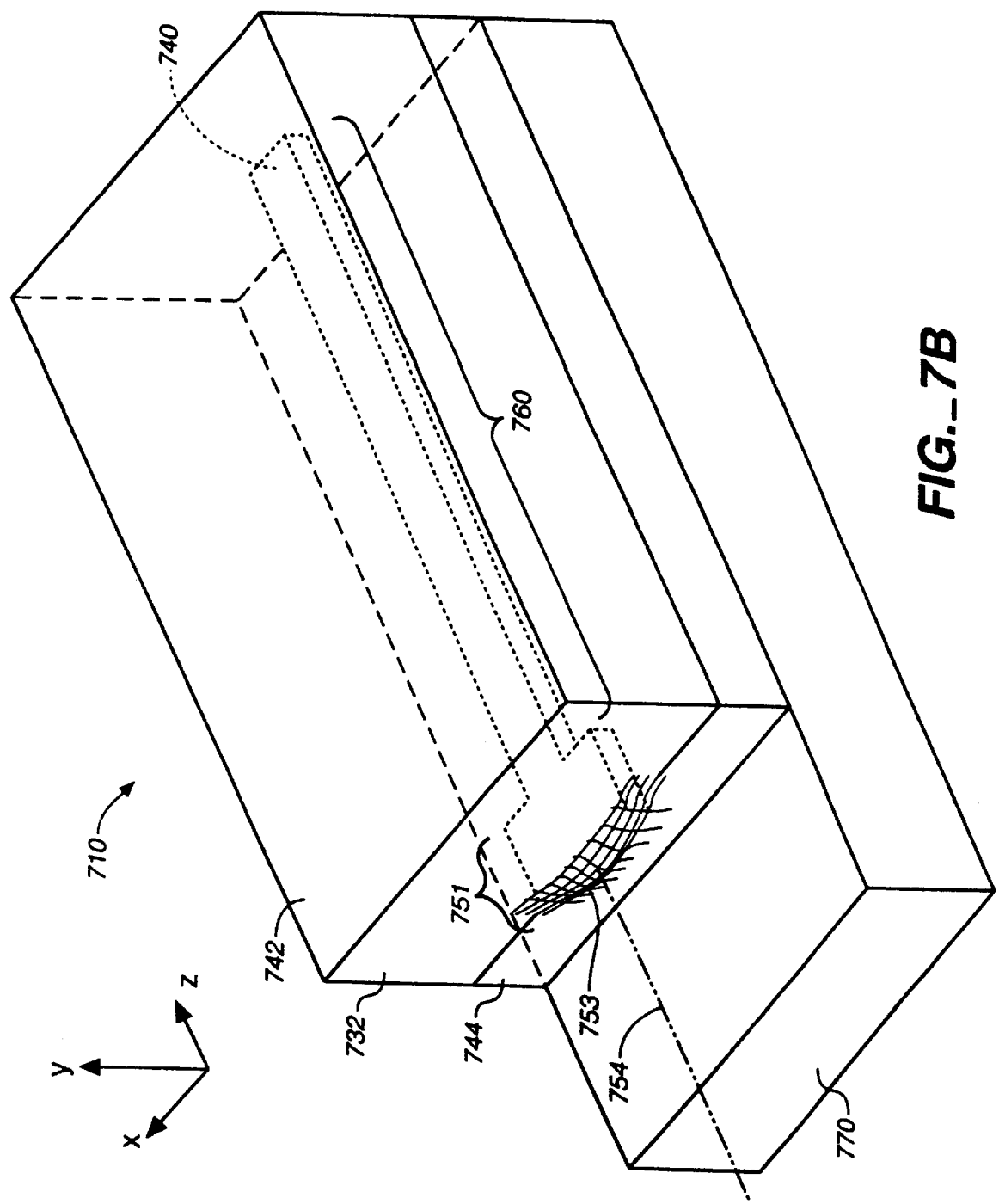
FIG._7B

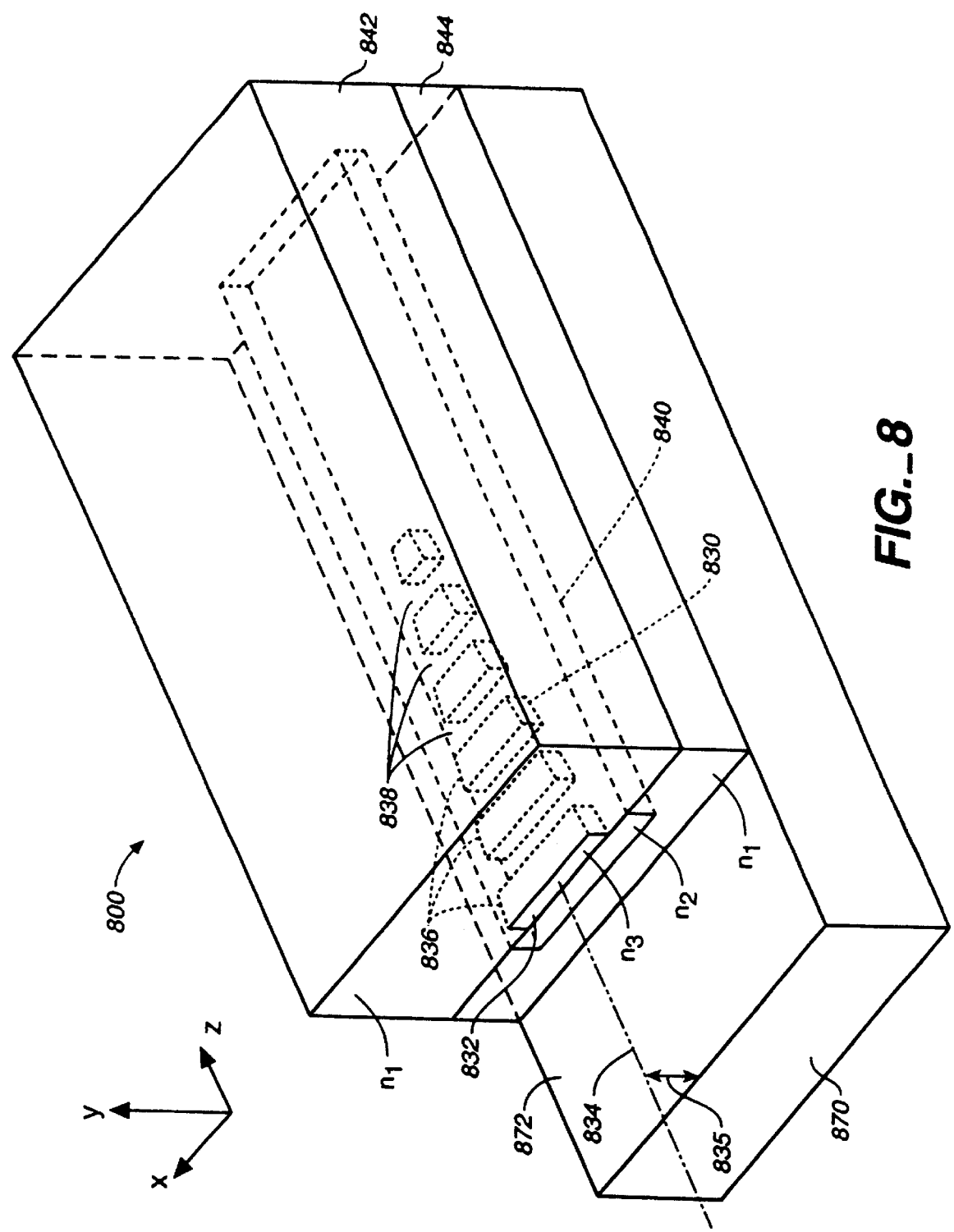
FIG._8

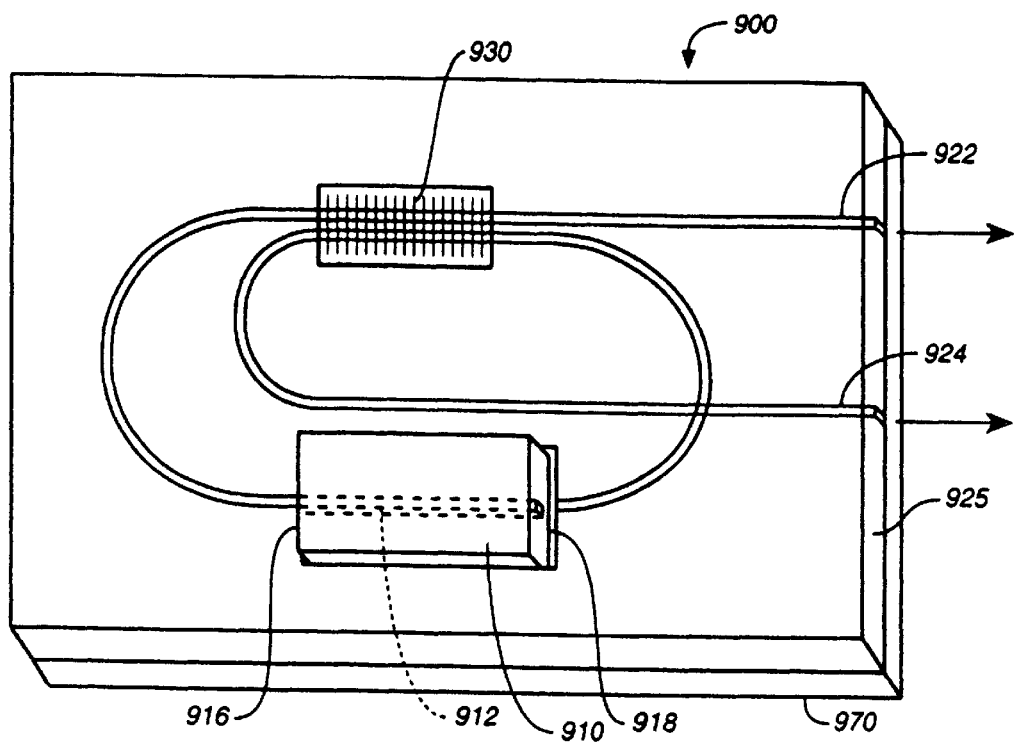
FIG._9
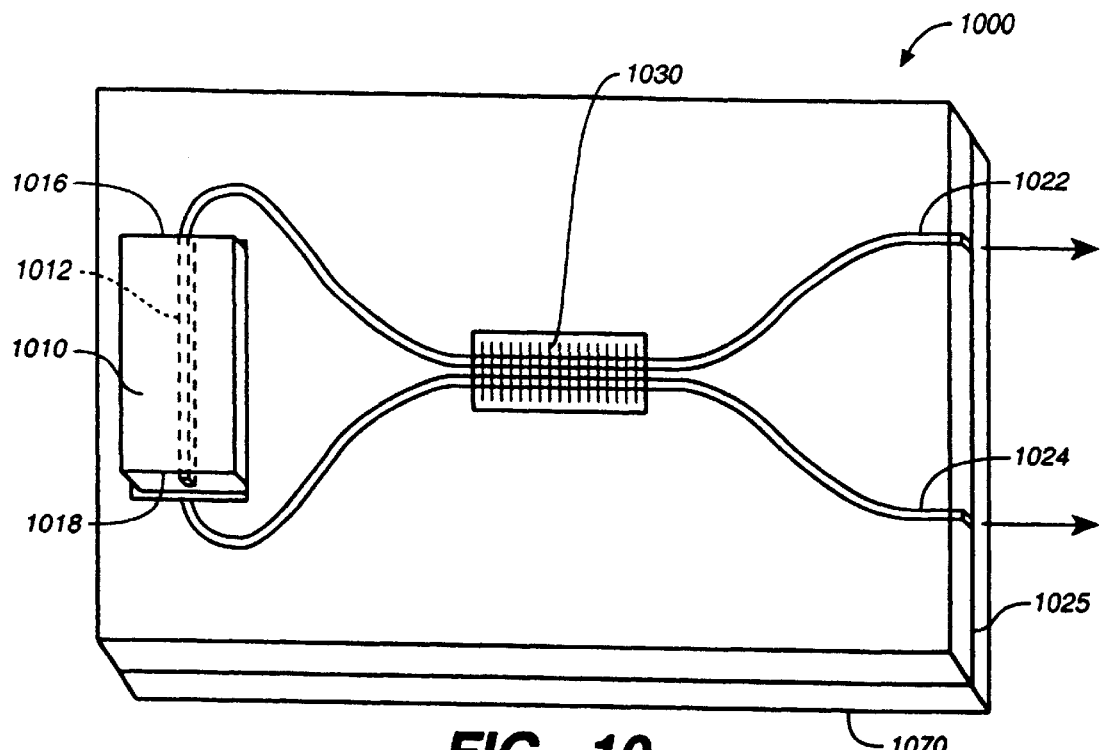
FIG._10

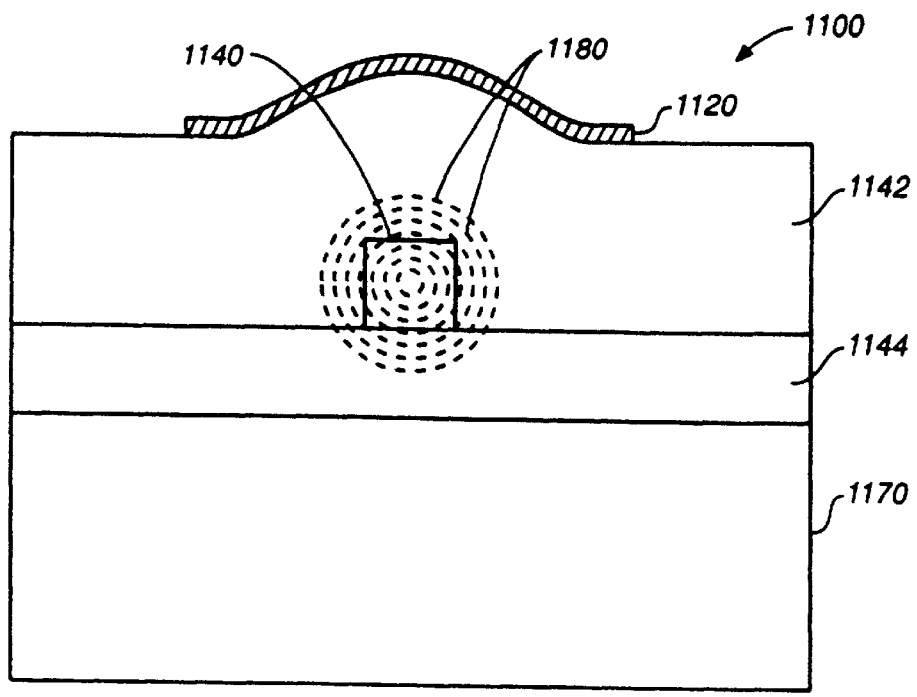
FIG._11A
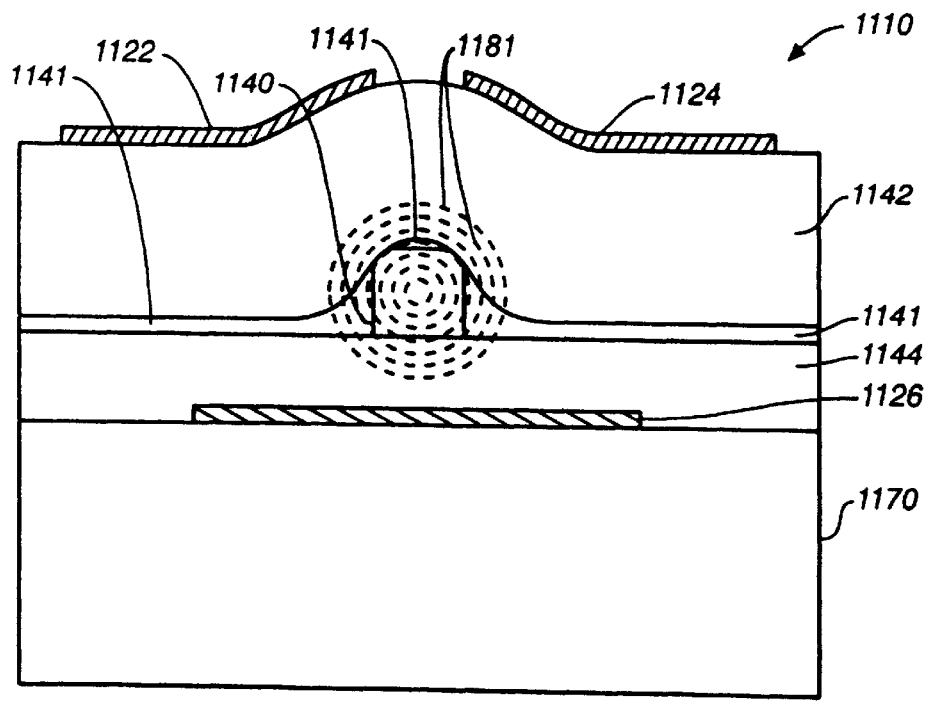
FIG._11B

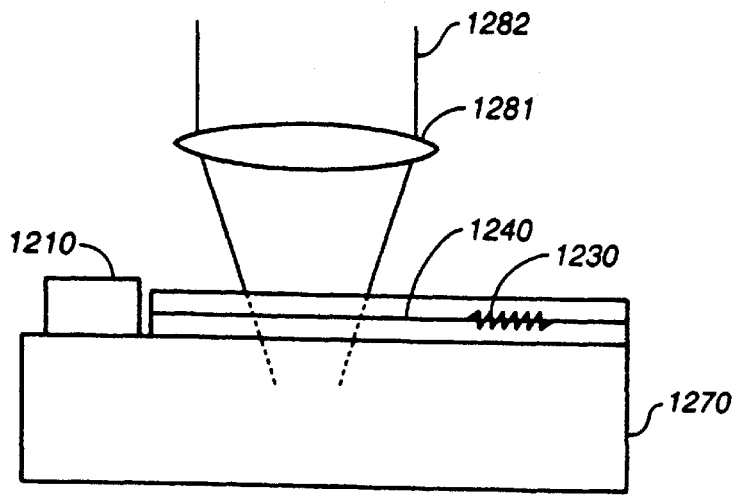
FIG._12A
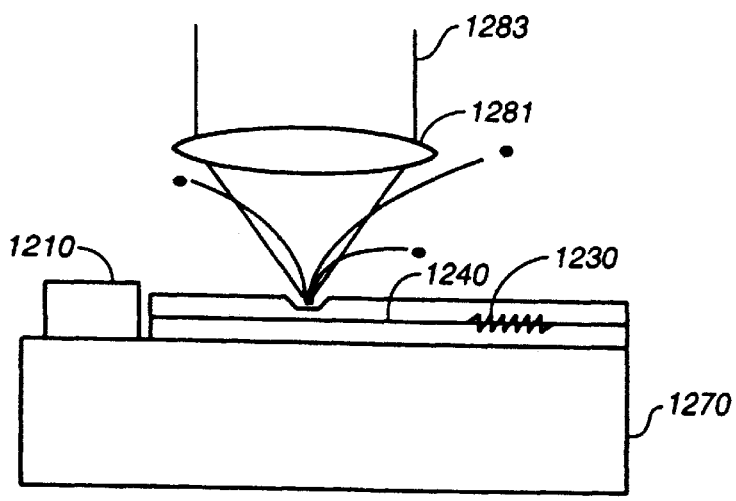
FIG._12B
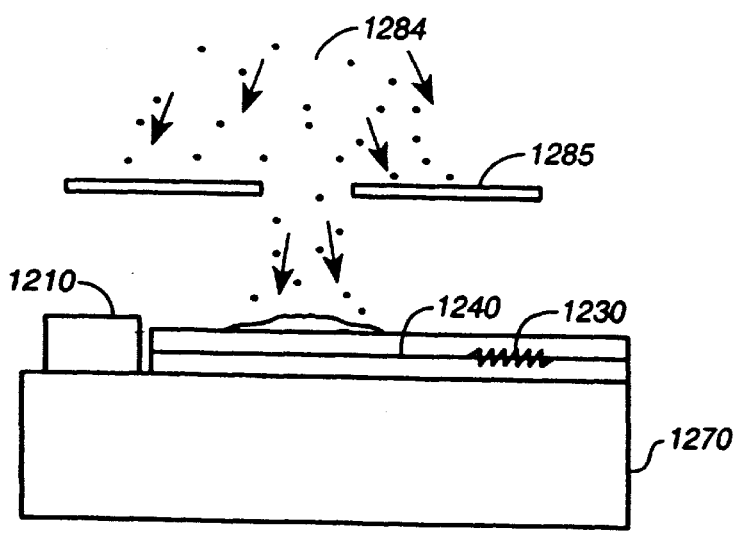
FIG._12C

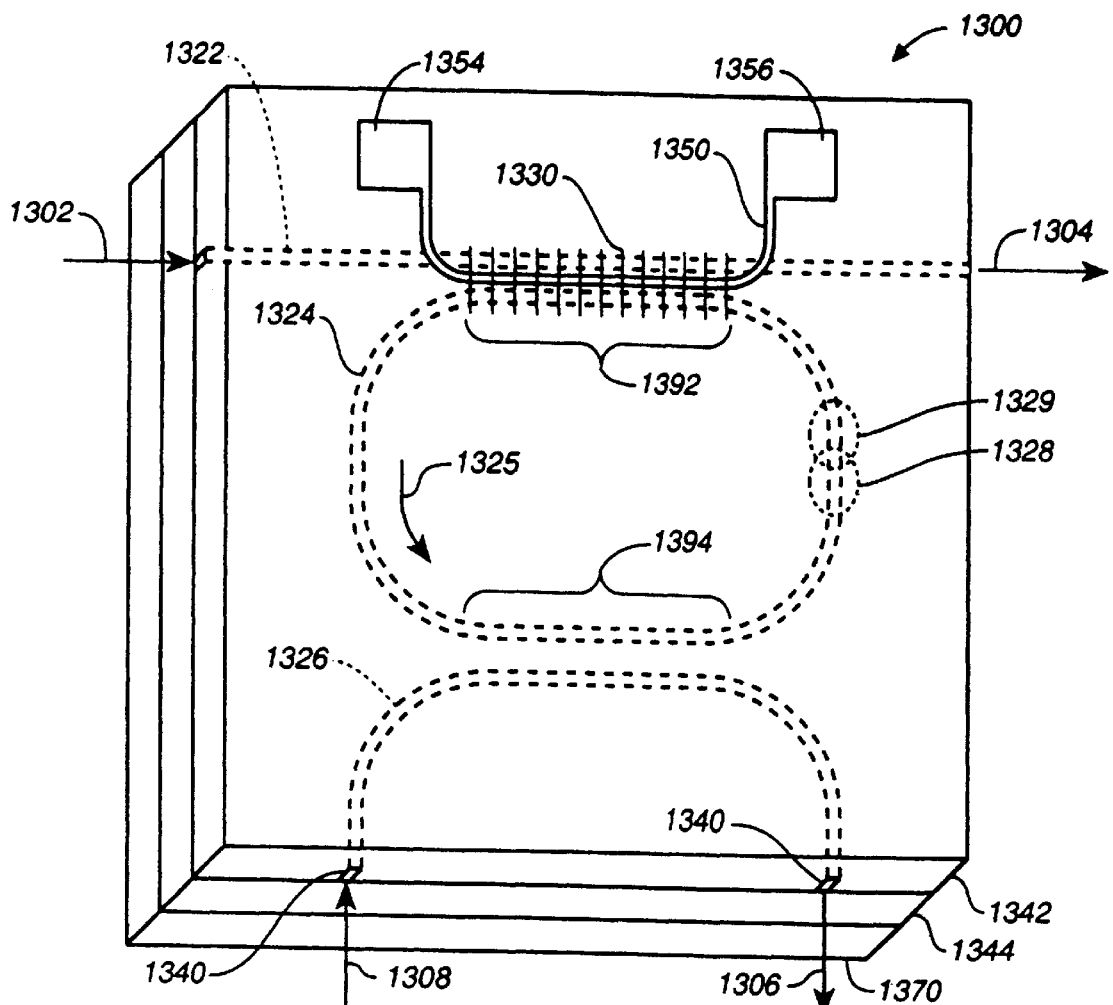
FIG._13
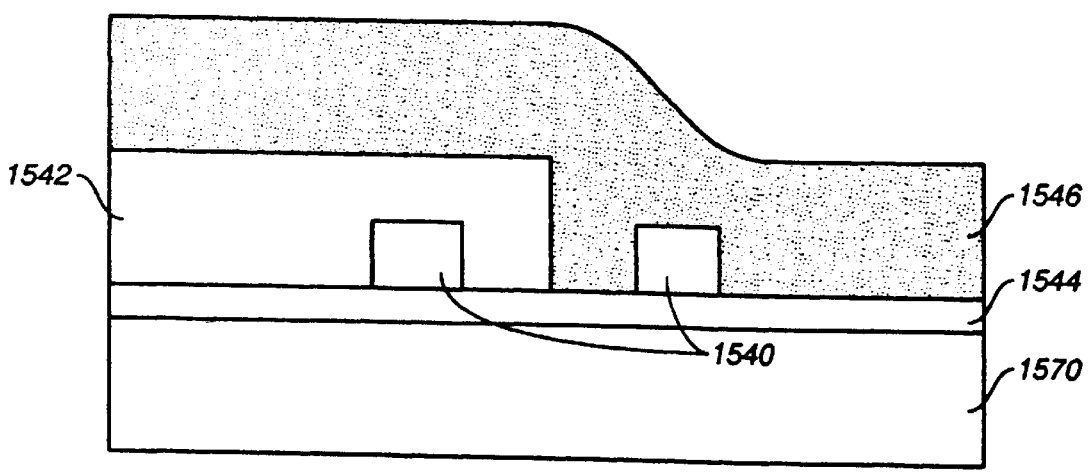
FIG._15

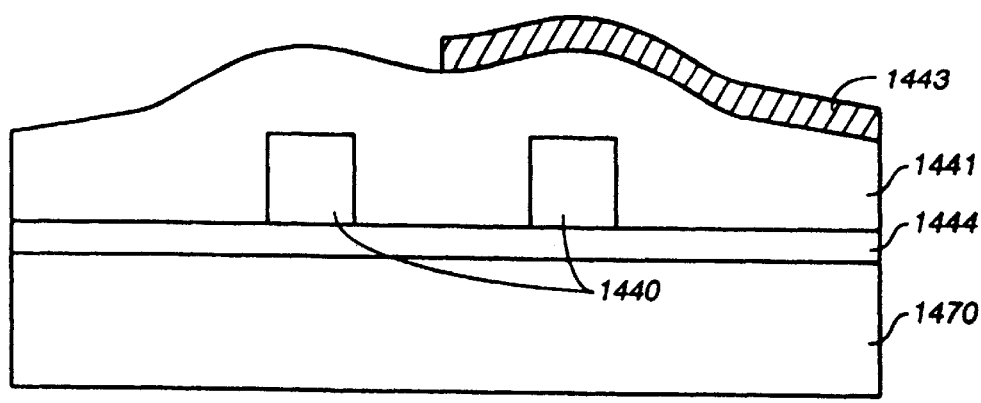
FIG._14A
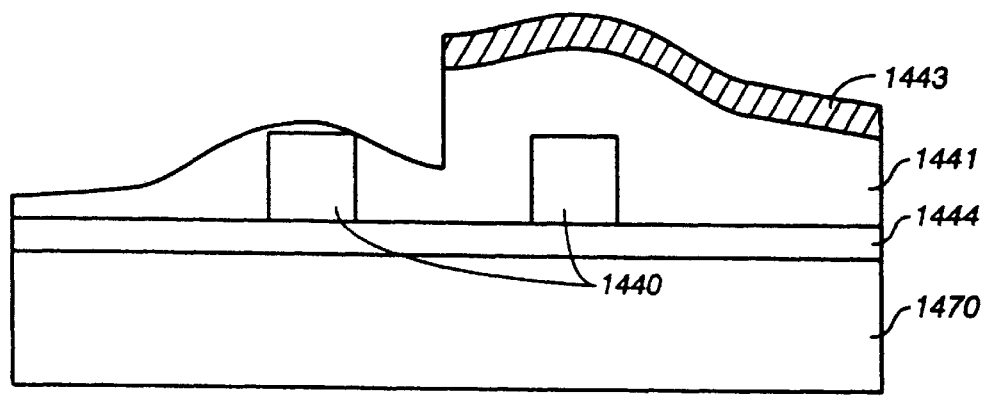
FIG._14B
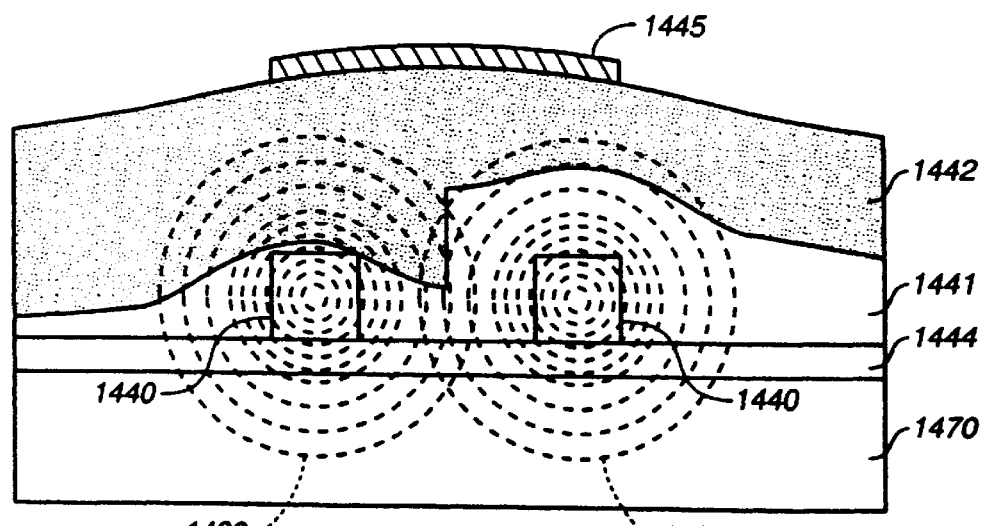
FIG._14C

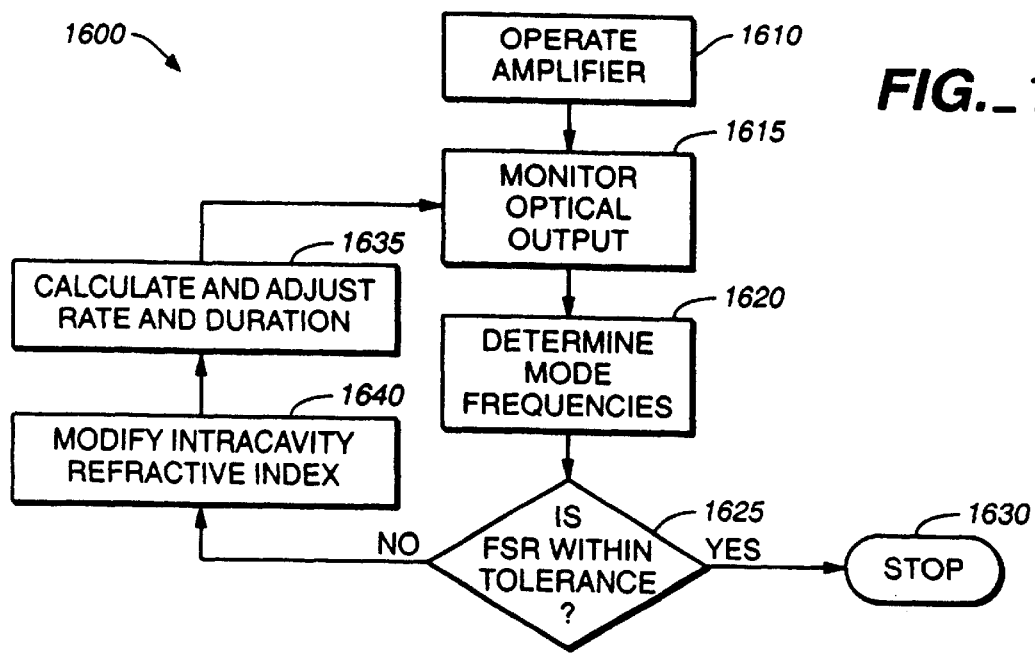
FIG._16
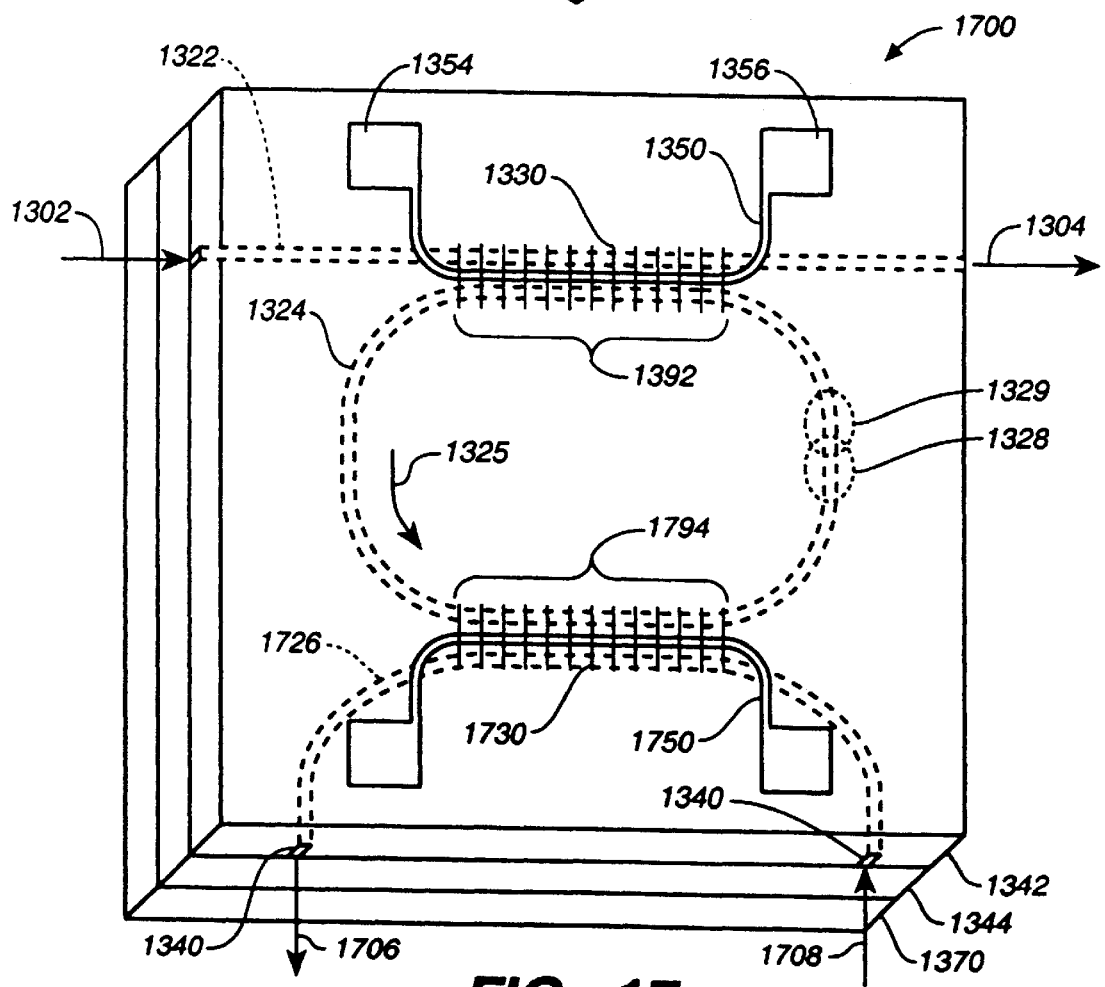
FIG._17

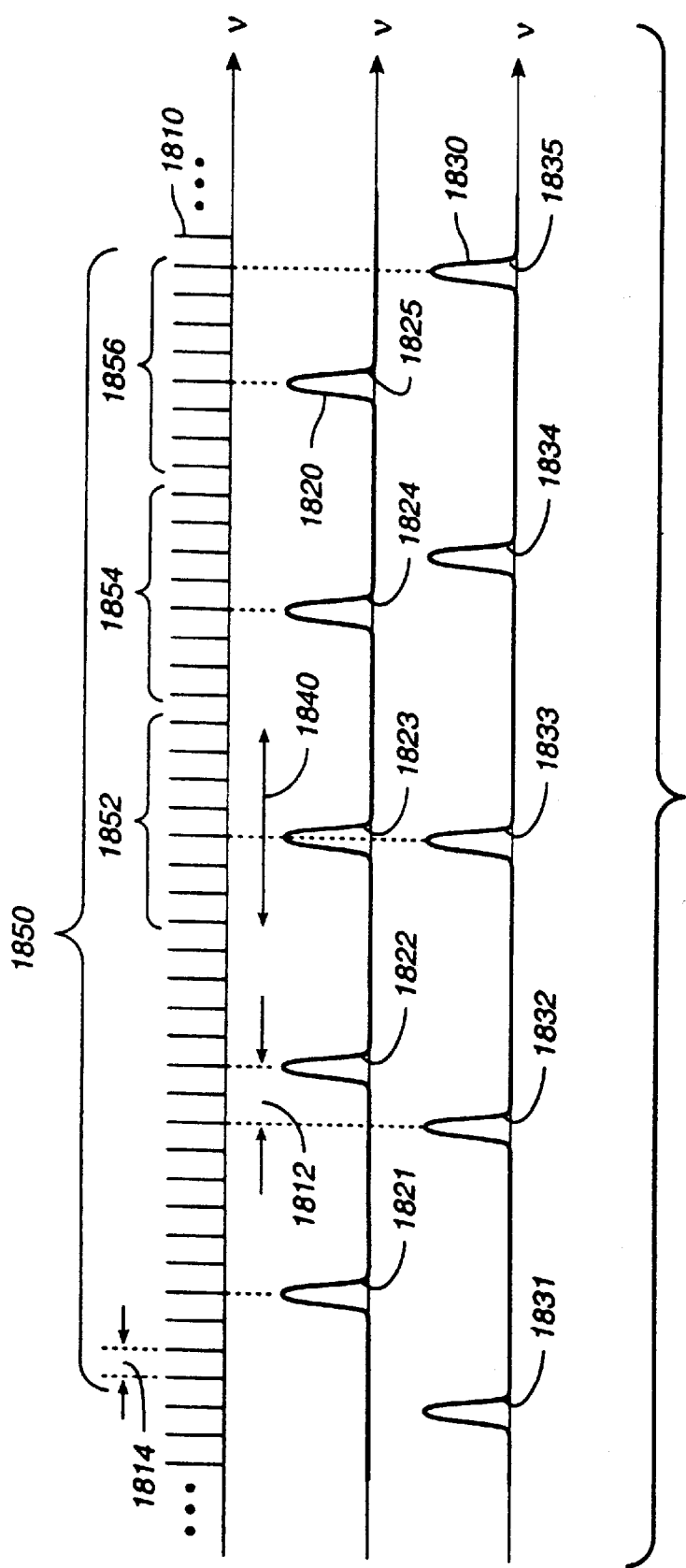
FIG._18

CHANNEL-SWITCHED CROSS-CONNECT

TECHNICAL FIELD

This invention relates to laser devices that produce optical energy of tightly controlled optical frequency, particularly for use in telecommunications applications. More particularly, the invention relates to devices that produce a specified optical frequency independent of thermal variations, while possessing the ability to be tuned or switched among alternative optical frequencies by thermal, electric field, or other control means without modifying the specified frequencies.

BACKGROUND ART

This invention relates to laser devices that produce optical energy of tightly controlled optical frequency, particularly for use in telecommunications applications.

More particularly, the invention relates to devices that produce a specified optical frequency independent of thermal variations, while possessing the ability to be tuned or switched among alternative optical frequencies by thermal, electric field, or other control means without modifying the specified frequencies.

The growth of demand for subscriber bandwidth has led to great pressure to expand the capacity of the telecommunications networks. Dense wavelength division multiplexing (DWDM) allows high bandwidth use of existing fiber, but low-cost cost components are required to enable provision of high bandwidth to a broad range of customers. Key components include the source, the detector, and routing components, but these components should preferably be addressable to any of the frequency channels. These channels are currently defined by the ITU as $v_n = v_0 \pm n\,dv$, where $v_0$ is the central optical frequency 193.1 THz and $dv$ is the specified frequency channel spacing that may equal a multiple of 100 GHz or 50 GHz. Systems have also been demonstrated based on other fixed spacings, and based on nonuniform frequency spacings.

Semiconductor lasers with built-in gratings such as DFB and DBR lasers are currently used to produce the frequency-specific lasers needed to transmit over optical fibers. However, current fabrication techniques do not allow high yield production of a given frequency channel because of index of refraction variations in the InP-based materials. Because silica, polymer, and other optical materials offer greater stability of index of refraction, many types of hybrid lasers have been tested in which a semiconductor gain medium is combined with a grating fabricated in another material. Single frequency hybrid waveguide lasers have been demonstrated with semiconductor waveguide amplifiers to obtain the benefits of frequency selectivity and tunability. See for example * J. M. Hammer et al., Appl. Phys. Lett. 47 183, (1985), who used a grating in an external planar waveguide, by * E. Brinkmeyer et al., Elect. Lett 22 134 (1986) and * E. I. Gordon, U.S. Pat. No. 4,786,132, Nov. 22, 1988 and * R. C. Alferness, U.S. Pat. No. 4,955,028, Sep. 4, 1990, who used a grating in a fiber waveguide, by * D. M. Bird et al., Elect. Lett. 27 1116 (1991) who used a UV-induced grating, by * W. Morey, U.S. Pat. No. 5,042,898, Aug. 27, 1991 who used a fiber grating with thermally compensated package, by * P. A. Morton et al., Appl. Phys. Lett. 64 2634 (1994) who used a chirped grating, by * D. A. G. Deacon, U.S. Pat. No. 5,504,772, Apr. 2, 1996, who used multiple gratings with optical switches, by * J. M. Chwalek, U.S. Pat. No. 5,418,802, May 23, 1995, who used an electro-optic waveguide grating, by * R. J. Campbell et al., Elect. Lett. 32 119 (1996) who used an angled semiconductor diode waveguide, by * T. Tanaka et al, Elect. Lett. 32 1202 (1996) who used flip-chip bonding, and by * J-M. Verdiell, U.S. Pat. No. 5,870,417, Feb. 9, 1999, who adjust for single mode operation. Single frequency hybrid waveguide lasers have also been demonstrated with fiber waveguide amplifiers. See * D. Huber, U.S. Pat. No. 5,134,620, Jul, 28, 1992 and * F. Leonberger, U.S. Pat. No. 5,317,576, May 31, 1994.

Many robust thermo-optic materials are available today including glass and polymer materials systems that can also be used in fabricating waveguide optical components. See * M. Haruna et al., IEE Proceedings 131H 322 (1984), and * N. B. J. Diemeer, et al., J. Light. Technology, 7, 449–453 (1989). Recently, thermally tunable gratings have been fabricated in polymer waveguides and resonators. See * L. Eldada et al., Proceedings of the Optical Fiber Communications Conference, Optical Society of America, p. 98 (1999), and * N. Bouadma, U.S. Pat. No. 5,732,102, Mar, 24, 1998.

Thermal compensation of laser resonators is a requirement in components that must operate robustly within the narrow absolute frequency bands of the DWDM specifications. Thermally compensated resonators have has been shown using polymer materials. See * K. Tada et al., Optical and Quantum Electronics 16, 463 (1984) and * Y. Kokubun et al., Proceedings of the Integrated Photonics Research Conference, Optical Society of America, p. 93 (1998). Thermally compensated packages for fiber grating based devices have also been shown. See * W. Morey, U.S. Pat. No. 5,042,898, Aug. 27, 1991, * G. W. Yoffe et al, Appl. Opt. 34 6859 (1995), and * J-M. Verdiell, U.S. Pat. No. 5,870,417, Feb. 9, 1999. Thermally compensated waveguides using mixed silica-polymer materials have also been shown to produce temperature independent characteristics. See * Y. Kokubun et al., IEEE Photon. Techn. Lett. 5 1297 (1993), and * D. Bosc, U.S. Pat. No. 5,857,039, Jan. 5, 1999. Silica-polymer waveguides have also been used for interconnecting laser devices. See * K. Furuya U.S. Pat. No. 4,582,390, Apr. 15, 1986.

The grating assisted coupler is a useful device for frequency control. Grating assisted couplers as described in * R. C. Alferness, U.S. Pat. No. 4,737,007, Apr. 12, 1988, are known in many configurations including with mode lockers, amplifiers, modulators, and switches. See * A. S. Kewitsch, U.S. Pat. No. 5,875,272, Feb. 23, 1999. Grating assisted couplers have been used in resonators including lasers, mode lockers, etalons, add-drop filters, frequency doublers, etc. See for example * E. Snitzer, U.S. Pat. No. 5,459,801, Jan. 19, 1994, and * D. A. G. Deacon, U.S. Pat. No. 5,581,642, Dec. 3, 1996. Combinations of gratings and Fabry-Perot filters have been discussed for the DWDM application. See for example * B. Ortega et al., J. Lightwave Tech. 17 1241 (1999).

SUMMARY OF THE INVENTION

According to the invention, an optical resonator is coupled to a waveguide with a tunable differential waveguide pair to produce a tunable device in which a resonator mode frequency is invariant with respect to the tuning. An intracavity waveguide segment of the differential waveguide pair has an effective index that is substantially independent of tuning. Tuning may be accomplished by changing the temperature of thermo-optic materials within the waveguide pair structure, or by applying electric fields to electro-optic materials or liquid crystals, or by applying stress or acoustic or other fields to appropriately sensitive materials. In a preferred embodiment, a grating coupler is used within the differential waveguide pair for narrow frequency selectivity. The grating may be tuned to select which of the resonator modes is coupled to the waveguide. The resonator may be adjusted so that a plurality of resonator mode frequencies coincide with a set of specified frequencies such as the DWDM optical channels in telecommunications applications. The free spectral range may be adjusted to equal a rational fraction of a specified frequency interval. In a particular embodiment, the resonator is an athermal polymer waveguide structure with a thermo-optically tuned grating reflector. In a further embodiment, the resonator is a ring resonator parallel coupled to an input waveguide and impedance matched so that a throughput of an input signal is substantially nulled. In another embodiment, a detector is coupled to the optical energy circulating in the resonator. In still another embodiment, a second coupler is provided that may be tuned independently of the first grating coupler. Methods are described of tuning individual couplers and a plurality of couplers.

The invention will be better understood upon reference to the following detailed description in connection with the accompanying drawings.

BRIEF DESCRIPTION OF THE DRAWINGS

FIG. 1 is an embodiment of a hybrid grating stabilized laser chip.

FIG. 2 is a packaged embodiment in cutaway view of a thermally stabilized integrated optic chip.

FIG. 3 is an embodiment of a laser chip coupled to a tapered waveguide.

FIG. 4 is an illustration of the z-variation of the effective mode indices of two coupled waveguides in a tapered waveguide chip.

FIG. 5 is a top-view schematic diagram of a curved laser waveguide array with an angled interface to a tapered waveguide array.

FIG. 6 is an embodiment of a coupling region between a waveguide and a V-groove.

FIG. 7A is an embodiment of a waveguide-end lens.

FIG. 7B is an alternative embodiment of a waveguide-end lens.

FIG. 8 is a segmented embodiment of a tapered waveguide coupler

FIG. 9 is a codirectional grating assisted coupler embodiment of a ring hybrid laser chip.

FIG. 10 is a reflective grating assisted coupler embodiment of a ring resonator hybrid laser chip.

FIG. 11A is a lateral cross section of a waveguide embodiment with single upper cladding.

FIG. 11B is a lateral cross section of a waveguide embodiment with double upper cladding.

FIG. 12A shows a hybrid grating stabilized laser embodiment seen in a longitudinal cross section being illuminated for adjusting a frequency of operation.

FIG. 12B shows a hybrid grating stabilized laser embodiment seen in a longitudinal cross section having material removed for adjusting a frequency of operation.

FIG. 12C shows a hybrid grating stabilized laser embodiment seen in a longitudinal cross section having material being deposited for adjusting a frequency of operation.

FIG. 13 is an embodiment of a tunable frequency-adjusted ring resonator cross connect device.

FIGS. 14A, 14B, and 14C show lateral cross sections of three stages of fabrication of a waveguide pair embodiment with differing waveguide thermal coefficients.

FIG. 15 is a lateral cross section of an alternative waveguide pair embodiment with differing waveguide thermal coefficients.

FIG. 16 is a flow chart of a method for adjusting the free spectral range of a resonator.

FIG. 17 is a dual grating embodiment of a tunable frequency-selective cross connect device.

FIG. 18 is an illustration of a vernier method of frequency tuning dual grating resonant devices.

DESCRIPTION OF PREFERRED EMBODIMENTS

Thermo-optic materials are both convenient and robust, and may be incorporated into optical devices that actuate or tune upon the actuation of a heater. However, for applications such as communications, thermally insensitive devices are required for reliability. This invention describes a unique way of including a highly thermally sensitive tuning component into a device that is, in key aspects of its operation, insensitive to temperature. In one embodiment of the invention, a frequency tunable laser is described that emits light which may be channel-switched among a set of prepared frequencies that are independent of temperature. In another embodiment of the invention, a frequency tunable cross-connect device is described that cross-connects a frequency which may be channel-switched among a set of prepared frequencies that are independent of temperature.

Tunable Laser Operation

As is known in the art, laser tuning involves two factors that are typically interdependent: a) tuning a frequency selective element such as a grating within whose interaction band operation will occur; and b) tuning the longitudinal modes of the laser that determine the exact optical frequency that will lase within the band of the frequency selective element. In the DBR (distributed Bragg reflector) laser, for example, changing the chip temperature shifts both grating and mode frequencies, typically at different rates, leading to mode hopping behavior.

In this invention, means are described for making the cavity free spectral range (FSR) independent of temperature for high reliability. Further, the cavity round trip optical length may be adjusted according to methods described herein to adjust the FSR to equal a specified frequency channel spacing. The cavity is thereby prepared to lase at the desired optical frequencies. If the cavity is designed to be athermal, it may also provide an absolute frequency reference to the communications channel frequencies independent of drifts in environmental temperature, and no external reference devices such as a wavelocker need be provided. The free spectral range of a cavity is given by $$FSR = c/(nL)_{eff} \quad (1)$$

where the round trip optical length $(nL)_{eff}$ is $$(nL)_{eff} = \Sigma_i (n_{i\,eff} L_i) \quad (2)$$

and where $n_{i\,eff}$ is the effective index of refraction of the mode in the $i^{th}$ segment traversed by the light in the cavity, $L_i$ is the physical length of the $i^{th}$ segment, and the sum is over all the path segments traversed in a round trip of the cavity. The effective index of an optical mode in a waveguide is the index of refraction of an equivalent uniform medium that would give a plane wave the same propagation constant $$\beta = 2\pi n_{eff}/\lambda \quad (3)$$

or wavenumber (where the electric field of the mode varies as $E \; e^{i\beta z}$ along the direction of propagation).

In an aspect of the present invention, the free spectral range of the cavity may be designed to equal a predetermined DWDM channel spacing set by a system integrator or by the ITU (International Telecommunications Union). In the preferred embodiment, the FSR is 50 GHz so that the effective round trip optical length of the cavity is 6000 microns. With the linear cavity shown in FIG. 1 and a preferred InP semiconductor laser chip length of 400 microns at an index of about 3.3, the optical length of the waveguide path between the edge of the laser chip and the start of the grating is about 1680 microns. If the effective index of the waveguide is about 1.45, its physical length is about 1160 microns, ignoring the small butt-coupling gap between the two waveguides.

In a variation of the preferred embodiment, the free spectral range of the cavity is designed to equal a rational fraction of a desired communications channel spacing $$FSR = (\text{communications channel spacing}) \cdot n/m \quad (4)$$

where n and m are integers. If the desired channel spacing is 50 GHz, for example, FSR=50·n/m GHz. This may be useful if n/m<1 to increase the physical length of the resonator by a factor of m/n, simplifying design and fabrication issues. In one example, if n=1 and m=2, the rational fraction is ½ and the desired cavity round trip optical path becomes 12000 microns, allowing more than double the space in the resonator for thermal compensation material, taper, etc. In this situation, the grating tuning requirements are still the same, but the laser frequency will hop in 25 GHZ increments if the grating is tuned continuously, with every other hop bringing the optical frequency to a desired communications channel. (Some communications systems can use 25 GHz channel spacing, in which case m=1 for this cavity length.) Or it may be useful if n>1 to interleave successively addressed frequency channels. In another example, if n=2 and m=1, the rational fraction is 2 and the laser will hop successively to every second communications channel, which might be useful for interleaving two devices in the frequency domain, or for increasing device stability against perturbations, ageing, and drifts. These approaches may also be combined, as in another example, with n=2 and m=3 where the round trip optical path becomes 9000 microns, and the laser frequency during operation will hop first to +33.3 GHz, then to +66.6 GHz, both frequencies in-between communications channels, and then to +100 GHz, a communications frequency two 50 GHz intervals away from the starting channel.

Athermal Cavity

In another aspect of the invention, a region of thermo-optical polymer may be incorporated within the laser resonator where the negative thermo-optic coefficient is exploited to produce an athermal free spectral range. For the FSR to be athermal or independent of device temperature, the device parameters may be chosen to satisfy the relation $$d(nL)_{eff}/dT = \Sigma_i (dn_{i\;eff}/dT \cdot L_i + n_{i\;eff} dL_i/dT) = 0 \quad (5)$$

within a tolerance, where the sum is taken over all the different longitudinal segments of the cavity along the optical path. See K. Tada et al., Optical and Quantum Electronics 16. 463 (1984). Since these quantities are all positive in the common non-polymeric materials including silica, silicon, InP, GaAs, glass, lithium niobate, lithium tantalate, etc., a hybrid or multiple material approach is needed. The conventional approach to achieving temperature compensation has been to make a large negative dL/dT in one of the lengths $L_i$ in the above summation (usually a path length in air) equal to the difference between two large lengths (usually overhanging members in a supporting structure, one pointing away from the cavity and the other pointing towards the cavity). By selecting an inward-pointing member to have a larger coefficient of thermal expansion than the corresponding outward-pointing member, the support structure can be arranged to reduce the path length $L_i$ as the temperature is increased. See for example W. Morey, U.S. Pat. No. 5,042,898, Aug. 27, 1991, "Incorporated Bragg filter temperature compensated optical waveguide device" and J. M. Verdiell, U.S. Pat. No. 5,870,417, Feb. 9, 1999, "Thermal compensators for waveguide DBR laser sources".

In the preferred embodiment of the present invention, a polymer material is used to provide the negative thermo-optic coefficient in the cladding of the waveguide, and the waveguide design is adjusted for a negative net change in index with temperature. The length of the polymer intracavity segment may be adjusted until equation (5) is essentially met, within a tolerance. Note that the material used need not strictly be a polymer; all that is necessary is the negative thermo-optic coefficient. This material is placed intracavity in order to affect the summation in equation (5). Since it is the effective index of refraction that appears in equation (5), it is sufficient that some optical energy propagating in the optical mode traverse the negative coefficient material in one segment of the round trip optical path. The polymer material may be used in the cladding or the core, or in both portions of the optical waveguide. Since the thermo-optic coefficient of polymers tend to be large, only a fraction of the optical mode volume swept out by the optical mode in a transit of the optical cavity need be occupied by polymer.

The cavity is preferably also made athermal without changing its FSR. To accomplish this objective, the preferred approach is to adjust the overlap factor and the thermal coefficient of the polymer while keeping the optical lengths at the values required for the desired FSR. With the above lengths, a round trip through the diode laser contributes about 0.2 micron/° C. to the first term of equation (5). Thermal compensation is achieved by the polymer waveguide if its net thermal coefficient (the change in the effective index of refraction with increase in temperature) is approximately $-9 \times 10^{-5}$ °C.$^{-1}$. (The second term of equation (5) is small.) While the core material in the preferred embodiment has a positive thermal coefficient and is traversed by the most intense part of the beam, the polymer cladding material has such a large negative coefficient that it can be effective in compensating the entire cavity.

The fraction of the optical mode power in the waveguide that propagates inside the polymer compensating material is given by the overlap factor $\Gamma_c$ $$\Gamma_c = (\text{mode power propagating in the polymer})/(\text{total mode power}) \quad (6)$$

which may lie in the range of a few tenths of a percent up to 40% or more, depending on the design of the waveguide core, and the placement of the optical polymer. For the preferred 2 micron square high contrast 2% silica waveguide on silica cladding, the exponential tails of the mode penetrate far out of the core into the polymer cladding as described below in relation to FIG. 11A. Assuming the index of refraction of the polymer has been adjusted in the preferred embodiment (by e.g. halogenation and/or mixing) to equal that of pure silica, the overlap factor is about $\Gamma=40\%$ since the polymer material forms the cladding on three out of four sides of the rectangular waveguide core. A polymer material with dn/dT of about $-23\times10^{-5\circ}$ C.$^{-1}$ will achieve thermal compensation of this resonator. Materials with larger negative dn/dT may be used with a design that has proportionately smaller overlap factor or smaller physical length through the negative dn/dT material. For example, if a material with dn/dT of $34\times10^{-5\circ}$ C.$^{-1}$ is used, the desired overlap factor is reduced to 26% in the above structure.

The tolerance within which equation (5) is satisfied depends on the application. In the case of the communications application, a mode frequency shift of a fraction of the communications channel spacing, say 5 GHz, may be tolerated over a temperature range of operating temperatures, which might be only a fraction of a degree for temperature regulated devices, or as much as 5° C., 50° C., or even higher for unregulated packages. A 50° C. range would imply a tolerance of about +−0.001 microns/°C. in equation (5). To achieve this tolerance in a real device, the waveguide lengths and the dn/dT of the polymer are preferably controlled to an accuracy of a fraction of a percent. Depending on the parameter values, the tolerance on the cavity length may rise to about 10 microns (for a wide 400 GHz channel spacing, for instance), or it may fall below one micron (for a narrow channel spacing).

When the grating is integrated with the thermally compensated waveguide design described above, an advantageous wide tuning range results. The tuning range of the polymer clad grating 130 or 132 is large both because of the large thermo-optic coefficient and large mode overlap factor of the polymer. When the temperature of the grating polymer is scanned over a 100° C. range, the grating wavelength tunes over approximately 9 nm for the above case of polymer material with $-23\times10^{-5\circ}$ C.$^{-1}$, and 40% overlap factor.

In operation, the device will settle to a given temperature profile along the optical path of the resonator. The laser amplifier generates heat, and will rise to a temperature above that of the polymer waveguide. Heaters or coolers attached to the device, such as a substrate heater or the TE cooler described in reference to FIG. 2, may also change the temperatures of the gain section and the intracavity waveguide. Once the device in operation has reached equilibrium, the thermal profile will vary spatially along the waveguide but it will be constant in time. Changes in ambient temperature will change the entire profile approximately by a constant amount. Particularly if the thermal conductivity of the substrate is large, such as is the case for the preferred silicon substrate, changes in ambient temperature will produce spatially uniform changes in the thermal profile. Such changes in temperature do not substantially change the mode positions or FSR in an athermal cavity as described by equation (5).

Laser Embodiment

FIG. 1 shows a preferred embodiment of the hybrid tunable laser chip 100. A semiconductor laser chip 110 is flip-chip bonded to the substrate chip 120 producing a hybrid of two integrated waveguide chips. The laser chip is preferably fabricated from InP so that it emits in the 1550 nm region or the 1310 nm region. The waveguides 112 and 114 provide optical amplification when excited by sufficient injection current, over an operating band of optical frequencies including a desired wavelength such as 1550 nm or 1310, 980, 860, 780, 630, or 500 nm, or another useful wavelength region. For a 1550 nm laser, a typical gain bandwidth would be about 50 nm (such as from 1520 to 1570 nm or from 1560 to 1610 nm), and would overlap a portion of the amplifying bandwidth of the Er-doped fiber amplifier either in the conventional band or one of the extended operating bands. The gain bandwidth may be smaller for lower injection current, or as large as 120 nm or more for high injection current and proper quantum well design. The two waveguides 112 and 114 of the laser chip are aligned in the x-z plane to butt couple to two passive (they provide no gain) waveguides 122 and 124 fabricated on the substrate chip. A substantial fraction of the energy emitted from the laser waveguides 112 and 114 is coupled into the planar integrated waveguides 122 and 124, where the coupling loss is preferably less than 10 dB or even less than 4 dB. Vertical alignment (in the y direction) of the laser chip 110 is obtained by controlling the thicknesses of the process layers in and on the laser chip and the substrate. Light emitted from the laser waveguides 112 and 114 is coupled into the waveguides 122 and 124 at the aligned butt coupled coupling region. Alternative gain regions include variations on the active region of semiconductor diode lasers, and fiber lasers, dye lasers, color center lasers, solid state lasers generally, or other amplifying media capable of providing optical gain over a useful frequency band.

Tapered waveguide segments 126 and 128 may be used to improve the coupling efficiency between the differently shaped waveguides 112 & 114 and 122 & 124. See FIGS. 3, 4, 7A, 7B, and 8.

The waveguides 122 and 124 may be integrated on the substrate 120 by one of a variety of common fabrication techniques. In the preferred approach, as is known in the art, silica waveguides are fabricated with low loss and good reproductability using the flame hydrolysis method. In flame hydrolysis, layers of particles produced in a flame (silica soot) are deposited onto the surface with a chemical composition determined by the inputs to the flame. Compaction of the particles into a solid film is typically accomplished during a subsequent high temperature consolidation process. Such waveguides are commercially available in various index contrasts using Ge doped core material, including 0.4%, 0.75% and 2%. Ge doped material has the further advantage of being sensitive to UV irradiation as is known in the art, allowing patterned regions of increased index of refraction (such as a grating) to be fabricated by exposure to patterned beams of light. Other dopants are also known to have light-sensitive index of refraction, which may occur as a result of a change in valence state. Most useful layer thicknesses are available, including core thicknesses in the range of 1 to 10 microns and beyond, and cladding thicknesses in the range of a few microns to hundreds of microns, if desired. Channel waveguides can be commercially fabricated according to customer design. Channel waveguides are typically fabricated by reactive ion etching (RIE) after deposition of the core material on the lower cladding material. The RIE step removes the higher index core material outside masked regions where retention is desired to establish light guiding. Subsequent to the channel waveguide fabrication, a top cladding of silica may or may not be applied according to the desires of the customer. If applied, the top cladding material is typically identical to the lower cladding material (pure silica) in index, surrounding the core material on all sides with cladding. In the preferred embodiment, we have selected high contrast, 2% waveguide core material, with a 2×2 micron channel dimension.

As an alternative the waveguides may be fabricated from spun-on polymer layers chemically selected with a raised index for the core layer, and patterned by RIE. Alternative substrates include InP, GaAs, glass, silica, lithium niobate, lithium tantalate, etc. Alternative waveguide materials include oxides such as $Ta_2O_5$, $Nb_2O_5$, $TiO_2$, $HfO_2$, and $SiO_2$, semiconductors such as silicon, GaAs, InP, polymers, and doped or mixed versions of all of the above materials with various dopants including phosphorus, hydrogen, titanium, boron, nitrogen, and others. Alternative fabrication methods include indiffusion, sputtering, evaporation, wet and dry etching, laser ablation, bleaching, and others. Many different waveguide structures are also available including planar, rectangular, elliptical, ridge, buried ridge, inverted ridge, diffused, air clad, hollow, coated, cladding stripped, 3-layer, 4-layer, 5-layer, etc. Combinations of the above materials, methods, and structures may be used as long as the process flows are compatible (i.e. do not result in decomposition, delamination, or unacceptable chemical change or physical modification of the materials of the semi-processed article), the optical losses are reasonably low (i.e. below 10 dB/cm for very short chips and below about 1 dB/cm for longer waveguides), and the transverse index of refraction profile of the finished structure has a locally higher index of refraction compared to adjacent materials in at least one dimension, creating at least a planar waveguide that guides light in one dimension or a channel waveguide that guides light in two dimensions.

FIG. 11A shows the preferred cross sectional embodiment of the waveguides 122 and 124 of FIG. 1. The waveguides have a polymer structure, fabricated with a silica under cladding, a patterned Ge-doped silica core, and an over cladding of a polymer material whose index of refraction has been selected to approximately equal (within a tolerance of less than about 1.5%) the index of the silica under cladding. The preferred polymer material is a deuterated and halogenated polysiloxane such as is described in M. Amano, U.S. Pat. No. 5,672,672, Sep. 30, 1997, as Compositions (G), (H), (13), (14), (18), (20), (23), or (24). Other polymer materials can also be used, including polysiloxanes, acrylates, polyimides, polycarbonates, etc., with optional deuteration or halogenation to reduce optical losses in the infrared, adjust the index of refraction, and adjust adhesion to other layers. Depending on the layer thicknesses, waveguide stripe width, and refractive indices, a substantial fraction of the mode energy propagates in the polymer cladding. This fraction may vary from a very small fraction of a percent up to many tens of percent. The cross section of the waveguide 1100 shows the optical mode 1180 represented by intensity contour levels propagating along a channel waveguide emerging from the page. The channel waveguide is fabricated on a silicon substrate 1170 with a silica lower cladding 1144, and an initially-uniform Ge-doped layer has been etched into a square ridge 1140 that forms the core of the waveguide. Spun on top of the ridge layer is the polymer upper cladding 1142, which shows a small bump above the ridge due to incomplete planarization in the spin and cure process.

The structure 1120 is an electrode. Depending on the nature of the materials used, its usage and properties are slightly different. For the preferred thermo-optic polymer device, layer 1142 is a thermo optic polymer, and the electrode 1120 is a resistive stripe for heating the structure of the waveguide in a controllable way. If the material 1142 is electro-optic such as a poled nonlinear polymer or for instance, the structure 1120 is an electrode for applying an electric field across the material 1142 towards another electrode which may be remote such as on the rear surface of the substrate or a package wall, or on the top surface shown but laterally displaced from the electrode 1120.

FIG. 11B shows an alternative waveguide embodiment with split top electrodes 1122 and 1124, a lower electrode 1126 provided below the lower cladding, and additional upper cladding material 1141. With lower electrodes as shown, the actuating voltage of an electro-optic device is lowered since the separation between electrodes so disposed is small. If the material 1142 is a polymer dispersed liquid crystal (PDLC) for example, a split electrode structure may be used to enable application of vertically and laterally oriented fields. This enables rotation of the applied electric field direction as well as changes in its strength, producing changes in the TE and TM indices of refraction of the PDLC film 1142. In further variations, the material 1140, 1144, or 1141 may be the tunable material with thermo optic, electro-optic, etc. properties.

The waveguides 112 and 114 are preferably curved near the front facet 118 of the laser chip so that the butt coupled interfaces lie at an angle to the direction of propagation of light in the waveguides, reducing the feedback from the coupling region. The front facet 118 may alternatively be antireflection coated, index matched, etc. These measures diminish the feedback from the front facet relative to the frequency selective feedback from the gratings 130 and 132, increasing the stability of the system.

FIG. 5 shows a detailed top view of the coupling region between the diode laser chip 110 and the waveguide 122. The laser waveguide structure 112 meets the HR-coated rear facet 116 of the diode laser at nearly normal incidence for good coupling of light reflected from the facet 116 back into the waveguide. However, the waveguide is preferably curved in the region 510, with a radius of curvature R, so that it meets the front facet 118 (which is preferably parallel to the rear facet 116) at an angle $\theta_i$. The performance of curved waveguide diodes is described in some detail in C-F. Lin et al., IEEE Phot. Tech. Lett. 8, 206, (1996). The angle $\theta_i$ is chosen to be large enough (preferably about 8°) so that the reflection from the interface at the facet 118 does not re-enter the waveguide, preventing feedback from this interface. The minimum desired angle depends on the contrast and dimensions of the waveguide, but as a rough rule of thumb it can be chosen larger than about 5° for a tight waveguide. Since the effective optical index of refraction inside the laser chip is approximately n=3.3 and the effective index of the tapered waveguide core 126 is about 1.49, the angle $\theta_r$ of the output waveguide will be approximately $\theta_r=18°$.

As mentioned in reference to FIG. 3, an index matching material is preferably applied in the gap between the laser chip 110 and the waveguide structure 126 & 122. The gap is more clearly shown in reference to FIG. 3 between the waveguide 330 and the waveguide 320. The interface region includes two interfaces, one between the waveguide 320 and the material in the gap, and a second between the material in the gap and the waveguide 330. The gap may be filled with air, vacuum, or a material with index of refraction close to but preferably somewhat above the geometric mean of the effective indices of the waveguides 320 and 330. (If the waveguide structure 122 and 126 is fabricated after the attachment of the diode laser to the substrate there may be no gap at this interface.)

As an alternative to the butt coupling arrangement between the two waveguides shown in FIG. 1, many other coupling approaches may be used, including lens coupling, grating coupling, and parallel coupling (including vertical coupling), and grating assisted coupling, as is known in the art. In the case of vertical coupling, the waveguide 122 is disposed parallel to and vertically separated from the diode laser waveguide 112, as would be obtained if the waveguide 122 is fabricated directly on top of the diode laser waveguide. The coupling between the two waveguides may be that of a broadband directional coupler, or it may be that of a narrower band grating assisted coupler.

Monitor photodiodes 140 and 142 may be placed to receive a portion of the light generated from the laser chip, in this case in proximity to the rear facet 116 of the laser which has preferably been high reflection (HR) coated, but which still transmits a portion of the light incident on the facet. As shown, the monitor photodiodes 140 and 142 are preferably waveguide detectors butt coupled to the laser waveguides 112 and 114. This butt coupling is non critical since the laser power is high and high detector efficiency is not critical. A large separation between the laser and monitor chips on the order of 50 microns or more is acceptable, making possible reduced positioning tolerance for this chip. If desired, one of many known configurations for the disposition of surface photodiodes may alternatively be used.

Grating regions 130 and 132 are tunable frequency selective feedback structures that reflect a portion of the light traveling in waveguides 122 and 124, providing feedback into the laser chips, and determining the wavelength regions in which the lasers oscillate (see E. I. Gordon, U.S. Pat. No. 4,786,132, Nov. 22, 1988, "Hybrid distributed Bragg reflector laser"). The gratings 130 & 132 and the rear facet 116 of the laser chip form the cavity mirrors for the laser oscillator of a hybrid external cavity, grating stabilized laser. The waveguides 112 and 114, the butt coupling regions, and a segment of the waveguides 122 and 124, respectively, including the tapers, form the intracavity optical path for propagation of optical energy within the resonator. These grating regions 130 and 132 are shown in a separate segment of the waveguides 122 and 124 from the tapered coupling regions 126 and 128. These separate segments of the waveguide may be identical to or may differ from the other segments of the waveguide either in structures or in materials. The grating structure may be fabricated in the core layer 1140, one of the cladding layers 1142, 1142, or 1144, or in multiple layers.

When the drive current through the laser waveguide 112 exceeds a threshold value, the gain provided exceeds the round trip optical loss of the oscillator, and laser operation is obtained. The FSR of the linear cavity of FIG. 1 is determined by the optical length between the first grating element and the rear facet 116 of the laser amplifier chip. The partial waves of the reflections from the other grating elements add in phase to determine the spectral characteristics of the grating reflection. Together, these partial waves also establish the amplitude and phase of the grating reflection coefficient at the location of the first grating element. Changes in index within the grating affect its spectrum but not the FSR of the cavity, whether those changes in index are uniform or have a complicated profile due to heating, the application of an electric field to electro-optic material, the application of stress, etc.

For single frequency operation as is required for high bandwidth communications, the width of the grating interaction band is preferably much smaller than the gain bandwidth of the amplifier but comparable to the FSR of the resonator containing the amplifying waveguide. If the full width at half maximum of the main grating reflection band equals the longitudinal mode spacing, only one mode at a time will lase. Adjacent modes will have lower gain, and will be clamped below threshold until the grating band is tuned far enough to equalize the modal gain of two adjacent modes. When gain equality is obtained for two modes during tuning, the operating frequency of the laser will jump suddenly from the oscillating mode to the adjacent mode the grating is tuning towards. It may be sufficient for the grating band full width at half maximum to be substantially larger than the FSR, but the laser stability will begin to become compromised as the band width becomes significantly larger. There are some advantages to having the band width smaller than the longitudinal mode spacing, but the laser might become power modulated or even extinguished as tuning progresses. By modulating the drive current, the laser intensity may be modulated, thereby modulating the output power coupled out of the waveguides 122 and 124 into the output fibers. The waveguides 122 and 124 may be modulated with separate data, providing multiple independent output channels, or simultaneously with the same data stream, providing a dual output device that can be independently routed to the desired destination for e.g. data communication protection purposes. Laser modulation may be accomplished by modulating the drive current through the stripe waveguides 122 and 124, or externally as is known in the art. Direct modulation is accomplished with low chirp in this configuration because changes in the drive current do not modulate the index of refraction of the gratings 130 or 132, and because the effective index of most of the optical path of the cavity is not modulated. The maximum rate of modulation is typically limited by the round trip time in the cavity to a fraction of the FSR, so if the FSR is set at 50 GHz, the modulation rate may be limited to 10 to 20 GHz.

Since the amplifier chip generates heat, changes in the average drive current will also change the longitudinal mode positions. It is therefore preferable to establish an average drive current that is maintained during operation. A constant drive current may be maintained during modulation using a transition-keyed modulation scheme, for example, if necessary. As the laser ages, its average drive current must rise to maintain constant output power and good modulation characteristics. It may be desirable to apply a compensating level of current to intracavity electrodes such as 150 and 152, for example, to maintain the channel frequencies despite the aging-related rise in laser temperature.

The grating regions 130 and 132 are preferably fabricated by patterned exposure through a phase mask as is known in the art. The grating may be fabricated in the Ge-doped silica core after sensitization with hydrogen or deuterium, or it may be fabricated in the polymer cladding prior to full cure so that the cladding material is still subject to chemical change such as by crosslinking. Alternative grating fabrication methods include exposure with interfering beams, patterning and dry- or wet-etching, or direct patterned etching, all of which are known in the art and may be applied to either core material or cladding material. For a purely periodic grating, the Bragg wavelength $\lambda_B$ for peak reflection in the retroreflecting configuration shown is given by $$\lambda_B = 2n_{eff}\Lambda/m, \quad (7)$$

where $\Lambda$ is the grating period, $n_{eff}$ is the local effective index of refraction of the mode, and m is the order of reflection. The result in equation (7) follows from the requirement that to accomplish phasematching, the wavenumber of the grating $2\pi/\Lambda$ must equal the sum of the forward propagating wavenumber in the waveguide and the reverse propagating wavenumber in the waveguide. With an effective index of about 1.446, Bragg wavelengths of 1552 nm and 1310 nm are obtained with grating periods of 537 nm and 453 nm, respectively. The exact wavelength of operation depends on all of the optical parameters of the waveguide, including the grating periods, and the refractive indices and thicknesses of the films traversed by the optical energy of the optical mode.

In practical devices, gratings are rarely strictly periodic, and the grating period, the grating index modulation, and the waveguide effective index of refraction may be varied along the length of the waveguide to achieve various effects such as apodization as is known to reduce sidemode reflection, to create multiple grating peaks as known for example in superstructure gratings and sampled gratings etc., or in general to engineer the shape of the reflection spectrum. In a laser resonator (or oscillator or cavity), it is preferable to chirp the grating period towards shorter period (in the direction of light propagation away from the amplifying waveguide segment) both for enhanced oscillator stability as shown by P. A. Morton et al., Appl. Phys. Lett. 64 2634 (1994), and for reduced sidelobe amplitude on the grating reflection bands as shown by A. Gnazzo et al., Integrated Photonics Research Conference, Optical Society of America, p. 410 (1996). The waveguide parameters such as lateral guide width may also be spatially varied, changing the effective index and the grating frequency as is known in the art.

The optical frequency band over which reflection occurs may take on very different forms according to the shape of the grating spectrum which may have only a single narrow peak, a broad peak, or a more complex multipeaked structure. The shape of the spectrum depends on the detailed design of the optical phase advance along the grating structure. A single peaked grating may be used to select a single channel, and a broad band or multipeaked grating may be used to select multiple channels or provide vernier tuning, etc.

The grating may be tuned (shifting the wavelength range for interaction with light) by changing either the grating period or the effective index of refraction of the light propagating through the grating. The grating period may be changed by expanding the material by one or more of several means including mechanical stretching or compression, heating or cooling, acoustic excitation, etc. The effective index in the grating may be changed by one or more of several means including the preferred thermo-optic effect, the electro-optic effect, the piezoelectric effect, etc. Materials are available that change their index of refraction in response to thermal, electric field, compression, shear, and other applied changes, including nonlinear optical materials, crystals, liquid crystals, and other types of material known in the art. Any portion of the material traversed by the optical energy of the light mode along the grating may be changed to affect a change in the grating spectrum. The thermo-optic effect is preferred for shifting the reflection band in a near-term product due to the availability of reliable polymer materials with large dn/dT.

The thermo-optic effect is the property of some materials of changing their index of refraction with temperature. Heating a segment of the polymer waveguide of FIG. 11A changes the effective index of refraction predominantly through the thermo-optic effect. The effect of thermal expansion is relatively small. A few materials have large thermo-optic coefficient (dn/dT) such as the active waveguide of the InP laser (dn/dT=$25 \times 10^{-5}$° C.$^{-1}$), and a few materials have a small rate of change of index with temperature such as silica (dn/dT=$1 \times 10^{-5}$° C$^{-1}$). Polymer materials are unusual in that their thermo-optic coefficient is negative and large (dn/dT in the range of $-10$ to $-35 \times 10^{-5}$° C.$^{1}$), see for example R. S. Moshrefzadeh et al., J. Lightwave Tech. 10 420 (1992). In this invention, we use polymer layers along the optical path to tune grating interaction frequencies, to tune resonant frequencies, and to render devices athermal by compensating the positive thermal change in index of refraction of other materials traversed by the optical energy. Useful devices are produced including in particular the combination of both thermally insensitive structures such as resonators, and strongly thermally tunable structures such as polymer gratings.

Changes in the temperature of the grating do not affect the FSR substantially if there is no substantial "leakage" of the grating thermal spatial profile into the resonant cavity. The cavity as a whole is in the preferred embodiment made athermal (compensated to be insensitive to uniform temperature changes). However, individual segments within the cavity may still have a substantial thermal coefficient. In the preferred embodiment, the structure of the waveguide 122 is the same in the grating 130 and in the cavity between the taper 126 and the grating 130. To the extent that a portion of the thermal spatial profile from the heater 160 overlaps the laser cavity, tuning the grating with heater 160 will still produce a residual change in the mode frequencies. Ideally, the temperature tuning of the grating is accomplished by an abrupt spatial thermal profile that changes the temperature of the grating but that does not change the temperature of the intracavity waveguide structure. By designing the heater electrodes 160 and 162 for low heating of the intracavity waveguide region outside the length of the grating, and by providing a high thermal conductivity substrate 120 such as silicon, and by keeping the thickness of the process layers thin between the grating waveguide and the substrate (subject to other constraints), we can minimize the effect of the thermal tuning of the grating on the longitudinal modes, so that the full tuning range of the grating can be realized while limiting the undesired mode tuning to a tolerance such as an acceptably small fraction of one FSR. As an alternative, a segment of the intracavity waveguide adjacent to the grating could be designed athermal in the region of "leakage" of the grating thermal profile.

Under such conditions, tuning the Bragg wavelengths of the gratings 130 and 132 by means of the currents flowing through the heater stripes 160 and 162 produces a series of discrete frequency jumps in the laser output (mode hops) from one longitudinal mode to the next, without changing the longitudinal mode frequencies. The optical frequency of operation tunes in a discontinuous, digital manner, without traversing the frequency range between the longitudinal modes of the cavity. If longitudinal modes coincide with communications frequency channels, the device changes communications channels digitally even though the current in the heater stripes may be changed continuously in an analog fashion. With digital tuning, the channel accuracy depends not on the accuracy of the tuning actuator (e.g. heater current), but on the accuracy of the specification of the channel frequencies.

A pair of serpentine heater traces 150 & 152 may be disposed about the waveguides 122 & 124, at a location between the grating regions 130 & 132 and the output facet 118. The heater traces 150 and 152 terminate in electrodes 154 and 156, and 158 and 159, respectively. Injecting a current through the electrode pair 154 and 156 excites the heater trace 150, raising the temperature of the waveguide 122 along a portion of its length as determined by the pattern of the heater trace 150 and the diffusion of the heat away from the trace and (ultimately) into the substrate. Likewise, injecting a current through the electrode pair 158 and 159 excites the heater trace 152, raising the temperature of a portion of the waveguide 124. The heater traces may be fabricated from stripes of resistive material such as platinum, nickel, Nichrome, conductive polymer, etc., and may be in the form of a single layer or of multiple layers as may be necessary to produce the desired properties of conduction or wirebonding or adhesion to the lower layer, or to modify the electrode response to subsequent process steps such as laser ablation, etching, etc. The stripe may be patterned as known in the art by lithographic means such as photo resist patterning followed by liquid or dry etch (e.g. chemical or RIE etch) of the resistive material and stripping of the resist. These electrodes and heater traces may be used to adjust the optical length of the round trip optical path of the hybrid external cavity grating stabilized laser, where the round trip optical path is the path followed by the optical mode through the resonator between successive passages through the same point in phase space in the resonator (such as a reflection from the grating or a coupling into an amplifying waveguide segment), and traversing the amplifier waveguide segment, and where $n_{i,\,eff}$ is the effective index of refraction of the mode in the $i^{th}$ segment traversed by the light in the cavity, $L_i$ is the physical length of the $i^{th}$ segment, and the sum is over all the path segments traversed. The heaters lower the effective index of the waveguides through the thermo-optic effect in the polymer cladding material in the region determined by the heat flow adjacent to the heaters. This reduces the optical length of the resonator, increases the FSR and tunes the longitudinal modes to higher frequencies, all other factors being constant.

In an embodiment of the invention, the round trip optical length may be adjusted by means of the heaters 150 and 152 to adjust the optical length and the free spectral range so that some of the resonator longitudinal mode frequencies coincide with a desired set of communications frequency channels. Or, the heaters 150 and 152 may be used to tune the operating frequency of the device in a continuous analog fashion.

Serpentine heater traces 160 & 162 may be disposed about the waveguides 122 & 124, at a location within the grating regions 130 & 132 and substantially traversing the entire grating regions. The heater traces 160 and 162 terminate in electrodes 164, 166, 168, and 169. Injecting a current through the electrode pair 164 and 166 excites the heater trace 160, raising the temperature of the waveguide 122 along grating region 130 as determined by the pattern of the heater trace 160, and the diffusion of the heat away from the trace and (ultimately) into the substrate. Again, the heaters lower the effective index of the waveguides through the thermo-optic effect in the polymer cladding material in the region determined by the heat flow adjacent to the heaters. The change in the effective index in the grating region tunes the frequency response of the grating as in equation (7); heating a grating segment increases its frequency of interaction. The gratings may be tuned together or separately simply by controlling the respective heater currents or powers. stripe pattern of the heater traces 160 and 162 is preferably uniform along the grating to form a thermal change as a function of heater current that is uniform along the length of the grating, thereby largely maintaining the spectral shape of the grating interaction. As shown, the stripe pattern traverses both sides of the waveguide in the grating region so that the thermal change is also more uniform across the lateral dimension of the waveguide. Use of a single heater stripe along the waveguide is a reasonable alternative that offers the advantage that all the gratings may be grounded together at one end.

Although the heater stripes 150 and 152 are also shown as serpentine, uniformity is not a requirement for tuning the round trip optical length of the resonator. The electrodes or pads 154, 156, 158, 159, 164, 166, 168, and 169 are preferably made of gold or other material that resists oxidation in order to enhance the bonding of connection leads to the heater power supplies (not shown). The locations of these electrodes are not critical, and may be moved to other locations on the chip, provided that the connections between the electrode locations and the heater traces have low resistance to reduce unwanted power consumption. Many other heater and electrode designs are available and useful for accomplishing the purposes described above.

In a variation of the invention, the thermal profile along the waveguide induced by the heater stripes may be made nonuniform along the length of the gratings by various means including varying the width of the stripes, varying the distance of the stripes from the waveguide axis, etc., so that the spectral shape of the grating interaction may be changed by a distributed thermally induced phase shift as a function of the heater current.

For thermo-optically tunable gratings, while the cavity may be made athermal, the grating itself cannot be athermal. For this reason, it may be desirable to stabilize the absolute temperature of the substrate, limiting the frequency sensitivity of the grating to changes in ambient temperature. If the substrate is thermally stabilized, the heater power provided to the grating may also be used to determine the absolute operating frequency. Some drift in the grating frequency is acceptable provided it does not cause a mode hop, so the substrate stabilization requirement is not very stringent. (In electro-optic, piezoelectric, etc. devices, the gratings are preferably designed to be intrinsically athermal, eliminating the need for substrate thermal stabilization.) To stabilize the substrate temperature, a simple temperature sensor may be attached at or near the substrate with an electronic control feedback loop provided as is known in the art to actuate a heater and/or cooler (such as the TE cooler 212) and regulate the temperature within a desired range.

A curved waveguide region 178 may be provided in the waveguides 122 and 124 on the chip 100 to bend the waveguides back through the angle $\theta_r$ to provide output coupling to a set of optical fibers that is parallel to the diode laser chip, allowing easy scaling of the design to multiple lasers on the same chip. By expanding the chip laterally (in the x-direction), a wider laser chip with 3 or 4 or more waveguides can be provided and coupled to additional waveguides laid out adjacent to the existing waveguides, with taper, grating, and heater sections, as well as output fiber V-grooves. The dual-bend configuration allows this to be done with identical length segments for each separate waveguide. The radius of the curved waveguides in the region 178 may be chosen to optimize the bend loss; a good choice for our 2% contrast silica waveguides is a radius of curvature larger than or equal to about 2 mm. Notice that the bends have been placed outside of the resonant cavity to reduce the length of the resonant cavity (increasing its modulation bandwidth) and to reduce its loss. An alternative design (not shown) incorporating this bend before or after the taper but before the grating (and therefore inside the cavity) has the advantage of greater compactness since the grating regions will also be parallel with the laser chip.

V-grooves 170 and 172 may be provided to aid in coupling a pair of fibers (not shown) to the output ends of the waveguides 122 and 124. The V-grooves extend across the bonding slot 176 and terminate in the alignment slot 174 whose vertical sidewall allows the butt coupling of the output fibers and the waveguides 122 and 124. The depth and position of the V-grooves are adjusted to align the core of the output fibers approximately coaxial with the waveguides 122 and 124 at the alignment slot 174.

FIG. 6 shows a detailed top view of the coupling region between the waveguide 122 and the V-groove 170. Alignment slot 174 is preferably fabricated with a nearly vertical sidewall 610 in which the waveguide core 122 terminates. A fiber is placed in the V-groove 170, gently pressed against the two angled sides of the V-groove, and gently pressed forward against the sidewall 610. Adhesive is placed in the region 179 (see FIG. 1) and cured, to affix the fibers in position. The bonding slot 176 prevents adhesive from wicking along the fibers or V-groove towards the optical interface at the sidewall 610. The position and angle of the V-groove in the x-z plane, and the depth of the V-groove are preferably set so that the attached fibers are aligned coaxial with the waveguide core 122. The fabrication of V-grooves in silicon, silica, and other substrates is known in the art, as is the slot design and the fiber attachment process, providing multiple alternative realizations.

The electrical connections to the common connection to the back surface of the laser, and for the laser diode stripes, are preferably made via wirebond connections to intermediate electrodes 181, 182, and 183, . . . , respectively. Connections to the monitor photodiodes 140 and 142 may also be made via wirebonds to connection pads (or electrodes) such as 184, 185, . . . , possibly also using 181 as a common connection. If common connections are electrically undesirable, as may happen in some electronic circuits sensitive to noise, separate electrodes may be used for each common function. For example, the monitor diodes may have one or even two separate common electrodes (not shown).

FIG. 2 shows a cutaway view of a package arrangement 200 for the hybrid chip assembly 100. The chip assembly 100 is preferably bonded at its lower surface 102 to two thermo electric coolers 212 and 214 bonded in series. Two coolers are preferably used to enable a large temperature difference between the chip 100 and the ambient temperature, making possible a wide ambient temperature range over which operation can be obtained while maintaining the chip 100 within its desired narrow temperature range. For broader or narrower operating ranges, more or fewer coolers may be used. If the range of ambient temperature excursion is as small as 5° C. or so, no cooler may be necessary. The TE coolers are in turn bonded to a heat sink 220 shown as part of the package made from one of several appropriate thermally conductive materials including copper, aluminum, Kovar, ceramic, etc. This heat sink may have fins or be attached to fins (not shown) for improved heat conduction into the ambient air. Electrical connections 230–233 are shown between the chip and the leads of the package 234 which emerge through isolating regions 236. The connections 230–233 may be directly to electrodes on the chip such as electrodes 164–169, or directly or indirectly (via electrodes 181–185. . .) to electrode regions on hybrid integrated elements such as the monitor diodes 140 or 142 or the laser diodes 112 and 114. The fibers connected to the chip assembly 100 emerge through the package either via connectors or seals (not shown). The sealing plate 240 may be soldered or welded to the rest of the package if a hermetic seal is desired to exclude humidity for example, or it may sealed with adhesive, or even replaced with a potting material if hermeticity is not required.

The frequency selective feedback structure may alternately be a grating assisted coupler in codirectional coupling or reflective coupling, a bulk-optics grating, a resonator or etalon either in bulk form or in a waveguide (as for instance fabricated by etching two parallel facets or trenches across a waveguide to form a waveguide Fresnel reflector), or other devices capable of selecting a spectrum within the optical frequency range that is then fed back into the amplifier medium by means of optical structures including bulk optics, waveguides, or other integrated optical components. Some of these structures are compatible with a ring laser embodiment including simple rings, multiple rings with interconnections, and more complex topologies in three dimensional waveguide structures.

Ring Laser Embodiment

FIG. 9 shows a ring resonator structure embodiment 900 which is an alternative to the linear resonator structure embodiment 100 of FIG. 1. The optical radiation emitted from the two facets 916 and 918 at either end of the amplifier waveguide 912 in the amplifier chip 910 is preferably butt coupled to waveguides 922 and 924, respectively. The amplifier chip 910 is preferably flip chip bonded to the substrate 970 on which the waveguides 922 and 924 are integrated. The waveguides 922 and 924 curve into a loop, passing each other closely in a parallel coupler region where their transverse mode profiles overlap but their effective indices $n_{\mathit{eff}1}$ and $n_{\mathit{eff}2}$ are preferably dissimilar enough to produce negligible coupling. Antireflection means are provided at the facets 916 and 918 from among the alternatives described above, as before including preferably angled waveguides at the facets, to reduce optical feedback and suppress lasing between the facets. An optical grating 930 overlaps optical energy flowing through the two waveguides, and provides the phase matching that allows coupling between the optical modes of the waveguides, allowing laser feedback to occur around the ring resonator formed by the two waveguides, coupler, and amplifier waveguide.

The grating period $\Lambda$ of the grating 930 needed to accomplish this coupling follows from the phasematching requirement that the wavenumber $2\pi/\Lambda$ of the grating must equal the difference in wavenumbers of the two waveguides, or $$\Lambda = \lambda / |n_{\mathit{eff}1} - n_{\mathit{eff}2}| \text{(codirectional coupler)} \qquad (8)$$

When $\Lambda$ approximately satisfies equation (8), the light traveling in one waveguide is coupled across the parallel coupler to the other waveguide, and the direction of propagation of the light is maintained in the same sense of propagation around the ring. For example, light emitted from the facet 918 is coupled into the waveguide 924, then across into the waveguide 922 by the grating 930, where it travels back towards the laser chip 910, is coupled back into the amplifier waveguide 912 at the facet 916. This light is amplified and emitted again at the facet 918, having made a round trip of the ring resonator. Light emitted from the facet 916 is coupled into waveguide 922 and travels in the opposite direction around the loop, so the ring resonator lases bidirectionally unless a unidirectional element (not shown) is introduced. Some of the light traveling in the waveguides 922 and 924 may be transmitted through the grating region and remain in its respective waveguide. This transmitted light is conducted by its respective waveguide to an output surface such as 925, where it emerges for use. The structures and usages described in respect of the individual embodiments herein also apply to the other embodiments. Therefore, for example, V-grooves may be used to align output fibers to the output ends of the waveguides at the output surface 925, adjustments may be applied to the optical length of the resonator to bring the FSR to equal a rational fraction of a communications channel spacing, a polymer material and heater stripes may be used within the grating region to tune the grating to couple different cavity modes between the waveguides 916 and 918, etc.

The ring resonator of FIG. 9 lases when the gain in the amplifier is sufficient to overcome the losses in the waveguide ring resonator. The loss will be lowest for the longitudinal mode of the cavity with frequency closest to the peak frequency of the grating interaction. Even if the suppression of the gain for the adjacent modes is small compared to the favored mode, the laser will oscillate on the favored mode. To obtain a good sidemode suppression ratio such as 30 to 50 dB, however, a significant difference in gain between adjacent modes is desired, so the grating is preferably designed with a substantial additional loss for all other modes. If the injection current of the laser chip is modulated to transmit data, two almost identical outputs are provided that are modulated with the same data. This characteristic may be advantageous in systems requiring a backup transmission line in case of network failure on one of the lines. The output from the two waveguides 922 and 924 may be identical but for the additional bending loss experienced by the waveguide 924.

The above is a specific implementation of the general situation in which light from an amplifier waveguide follows a first path to couple with a grating structure and then returns to the amplifier following a second path, the optical path forming a closed loop figure in two or three dimensions. The entire loop in FIG. 9 is comprised of waveguide segments, and the grating structure is a grating assisted parallel coupler within the loop. The ring resonator of FIG. 9 is preferably made athermal and its modes adjusted to coincide with specified frequency channels. For a tunable grating device, it is preferable for the tuning mechanism to leave unchanged the cavity FSR, while tuning the grating interaction frequency. The accomplishment of these objectives is more complicated in this case since the grating lies intracavity. The preferred approach is to make the thermal coefficients equal and opposite for the two adjacent waveguides in the grating region 930.

An on resonance mode that couples across the grating assisted parallel coupler will traverse the same path length on each side of the coupler. The thermal dependence of the two waveguide segments then compensate each other when the grating temperature is varied symmetrically about the center of the grating. Since it is the difference in propagation constants that tunes the grating in a co-directional coupler, equal lengths of opposite thermo-optic coefficients add to produce a net thermal tuning sensitivity.

Equal and opposite thermal coefficients in a pair of waveguides may be accomplished with one of the structures described in reference to FIGS. 14C and 15. By adjusting the thickness of the layer 1542, or the depth of the etch shown in step 14B, the amount of overlap of the left mode (e.g. 1482) in the polymer material 1442 or 1546 may be adjusted. A second adjustable design parameter is provided in the case of FIG. 14C by the thickness of the layer 1441, and in both cases by the thermo-optic coefficient of the material 1442 or 1546. Adjusting these linearly independent parameters is sufficient to bring the thermo-optic coefficients of the two waveguides to the desired values, whether equal and opposite, or zero and negative, or some other useful combination.

An alternative method of rendering the tuning of the device 900 athermal is to apply a simultaneous heating input to the semiconductor diode region 910. The opposite thermal coefficient of the semiconductor amplifier results in cancellation of the effects of the grating waveguides on the FSR during tuning provided that the relative amounts of heat input are adjusted to produce equal and opposite optical length changes. A wide tuning range may preferably be obtained in this case by making one of the waveguides in the grating region athermal while the other has a maximum negative dn/dT.

FIG. 10 shows an alternative implementation 1000 wherein the grating in the parallel coupler is a reflective grating and the reflected light is coupled over to the second waveguide, which then spatially diverges from the first waveguide, bringing the reflected light back into the amplifier waveguide segment via a different optical path. Reflective gratings typically offer narrower bandwidth which can be advantageous in producing high side mode suppression ratio. In a similar way to FIG. 9, the optical radiation emitted from the two facets 1016 and 1018 at either end of the amplifier waveguide 1012 in the amplifier chip 1010 is coupled to waveguides 1022 and 1024, respectively, with antireflection means. The amplifier chip 1010 is flip chip bonded to the substrate 1070. The waveguides 1022 and 1024 curve into a loop, passing each other closely in a parallel coupler region where their transverse mode profiles overlap but their effective indices $n_{\mathit{eff}1}$ and $n_{\mathit{eff}2}$ are preferably dissimilar enough to produce negligible coupling. An optical grating 1030 overlaps optical energy flowing through the two waveguides, and provides the phase matching that allows coupling between the optical modes of the waveguides. The grating period $\Lambda\Lambda$ of the grating 1030 needed to accomplish this coupling follows from the phase-matching requirement that the wavenumber of the grating $2\pi/\Lambda$ must equal the sum of the wavenumbers of the two waveguides, or $$\Lambda = \lambda/(n_{\mathit{eff}1} + n_{\mathit{eff}2}) \text{(contradirectional coupler)} \quad (9)$$

When $\Lambda$ approximately satisfies equation (9), the light traveling in one waveguide is reflected and coupled across the parallel coupler to the other waveguide. Again, the direction of propagation of the light is maintained in the same sense of propagation around the ring. For example, light emitted from the facet 1018 is coupled into the waveguide 1024, then across into the waveguide 1022 by the grating, where it travels back towards the laser chip 1010, is coupled back into the amplifier waveguide 1012 at the facet 1016. This light is amplified and emitted again at the facet 1018, having made a round trip of the ring resonator. Light emitted from the facet 1016 is coupled into waveguide 1022 and travels in the opposite direction around the loop, so the ring resonator lases when pumped above threshold.

Some of the light traveling in the waveguides 1022 and 1024 is transmitted through the grating region and remains in its respective waveguide. This transmitted light is conducted by its respective waveguide to an output surface 1025, where it emerges for use. The lasing characteristics of the device 1000 are similar to those of the device 900. As always, the structures and usages described in reference to the other figures may also be applied in various alternative embodiments of the devices in FIGS. 9 and 10. The thermal coefficients of the two adjacent waveguides in the grating region 1030 are preferably equal to each other. Temperature tuning the grating does not change the optical length of the resonator if the thermal profile for tuning the grating ends abruptly at the edge of the grating. Since it is the sum of propagation constants that tunes the grating in a contra-directional coupler, equal thermo-optic coefficients in equal length waveguide arms combine to give a net tuning range.

Method of Adjusting a Resonant Cavity

Due to fabrication tolerances, the FSR of a batch of devices will vary with a mean and standard deviation that may not allow a high production yield. A method is needed that allows the FSR of individual devices to be adjusted to the desired value. A further method is needed that allows the absolute frequency of longitudinal modes to be adjusted to coincide with (fall within the acceptance band of) one of the assigned frequency channels.

FIGS. 12A, 12B, and 12C, in another aspect of the present invention, show methods of adjusting the resonant cavity, including exposing Ge-doped silica, crosslinking a polymer, ablating intracavity material, and depositing additional material in a region traversed by intracavity optical energy, and including a method of measuring and applying these methods to produce the desired communications FSR within one tolerance, and to overlap a desired optical frequency within another tolerance.

FIG. 12A shows the preferred method of adjusting the FSR to the desired value. The waveguide 1240 is illuminated through optical system 1281 with electromagnetic radiation 1282. In response to an exposure, the material of the waveguide 1240 changes its index of refraction, changing the optical length between the reflecting facet of laser chip 1210 and the grating 1230. Verdiell, U.S. Pat. No. 5,870,417, Feb. 9, 1999, has shown UV illumination of an intracavity silica fiber being used to shift the longitudinal modes of a resonator. In this invention, the FSR must first be brought within tolerance before the longitudinal modes can be tuned to a desired location. Many materials respond to electromagnetic radiation by changing their index of refraction, and the frequency of the electromagnetic radiation may be low or high according to the mechanism of the interaction (which may include heating with any of the frequencies, and other effects such as structural change or chemical change). It is known that polymer mixtures containing photoinitiator molecules will cross-link at C=C double bonds, therefore gradually changing index of refraction when exposed to visible or UV light with sufficient photon energy to activate the photoinitiator molecule. Other materials also change index with exposure, including silica, for example, which in the presence of the Ge dopant will gradually increase in index when exposed to an energy beam of ultraviolet light, and dye doped polymers wherein the exposure induces a chemical change such as a bleaching or molecular configuration change in the dye. Whatever the mechanism may be for the radiation-induced intracavity change in index of refraction, these methods may be applied to change the FSR of the resonator, either increasing or decreasing it according to the nature of the material modification that is being induced.

The use of ultraviolet or visible light is advantageous in that the projected energy beam may pass through several layers of the device structure, enabling change in index of material that is buried underneath other layers. For example, a suitably prepared $Ge:SiO_2$ core may have its index adjusted by UV radiation even though it is buried underneath a polymer cladding or protective layer, provided that sufficient UV radiation reaches the core material. In another example, a crosslinkable polymer layer such as a top cladding layer may be index adjusted by UV or visible light exposure through an upper protective layer that could have a different composition. Or, if there is no upper protective layer, the lower part of the polymer cladding layer, through which a portion of the optical radiation passes, may be index adjusted by light that passes through the upper portions of the cladding layer which are remote from the optical mode.

To achieve the desired FSR in the cavity by correcting it with UV exposure of Ge-doped silica (that decreases the FSR with progressive exposure), the fabrication parameters prior to correction may be chosen to produce a target FSR that is slightly larger than the desired value so that the main part of the statistical distribution of FSR in fabricated but uncorrected devices lies above the desired FSR. The direction of the pre-correction deviation of the target FSR is preferably chosen opposite from the sense of the correction technique, thereby allowing a single technique to be used (in this case increasing the intracavity index) to produce the desired FSR in this main part of the distribution. Ideally, the target FSR differs from the desired ending value by a mean amount comparable to or larger than the standard deviation of the FSR so that most of the distribution lies on the same side of the target value. The target FSR is also preferably chosen to differ from the desired FSR by not more than the amount of change in FSR that can conveniently be accomplished by applying the exposure. Good control of FSR correction may be accomplished by making successive measurements of the FSR of an individual resonator while applying successive exposure steps, each exposure being smaller than the total exposure needed for full correction. The energy in the exposure beam may be adjusted on each step according to the desired amount of optical length adjustment for that step. The spatial region being exposed may also be changed during the adjusting process, which has the advantage of allowing a larger net change in optical length, and a greater precision. The free spectral range may be measured by measuring the optical spectrum of the laser for two or more longitudinal modes, and this method may be repeated until the FSR of the cavity equals a rational fraction of a communications channel spacing within a tolerance such as a few percent of the channel spacing.

To achieve the desired overlap of a subset of longitudinal modes with assigned frequency channels, after the FSR has been set to the desired rational fraction, the frequency of one of the modes is shifted to coincide with the desired assigned channel. If the free spectral range is equal to the assigned communications channel spacing, and one longitudinal mode has been aligned to coincide with one of the channels, all longitudinal modes will coincide with assigned channels within a frequency range of linearity.

FIG. 16 shows the method of adjusting the cavity which consists of the steps shown in the flowchart 1600. The amplifier section is preferably operated in step 1610, preferably above the threshold of the resonator, in which case there is a narrowing of the spectrum around the longitudinal modes of the resonator. There is an optical output that can be used to determine the longitudinal modes either above or below the threshold, but the laser is preferably operated above threshold since both the output power and the spectrum depend on the drive current. In a variation of this method, step 1610 is modified to become the step of operating a light source to illuminate the optical path of the resonator.

In step 1615 the optical output from the cavity is monitored and in step 1620 its spectral features are determined. Specifically, the center frequencies of at least two longitudinal modes are identified in 1620 in order to determine the FSR. This step can be accomplished either above or below threshold. In step 1640 the refractive index of the resonator is modified after calculating the desired rate or duration of the exposure in step 1635. The rate and duration of exposure are preferably calculated based on the information produced from steps 1615 and 1620. The modifying step 1640 may be accomplished in parallel with step 1615 to ensure there will be no overshoot, and steps 1620 and 1635 may also be accomplished simultaneously. In step 1635, the process is adjusted (e.g. the rate and duration of the process) so that the measured FSR approaches and eventually equals the desired FSR within a high degree of accuracy. When it is determined that the target FSR is being approached, the modification rate is preferably decreased, and when it is determined in step 1625 that the target FSR is achieved within a tolerance, the optical length modification may be stopped in step 1630.

FIG. 12B shows an alternative method of adjusting the FSR by removing material traversed by the mode in the laser cavity. Methods that remove material include the preferred laser ablation, but also ion beam etching and other techniques. It is known that many materials that absorb UV light will ablate when exposed to a sufficiently high short pulse exposure of millijoules or Joules per square centimeter. The energy beam 1283 that is projected onto the intracavity waveguide is preferably an excimer laser beam that may be directed, focused, or imaged onto the surface after passing through a mask in the optical system 1281. Each laser pulse typically ablates a few tenths of a micron of material from the air/material interface, over a spatial extent that may be defined by the laser beam or by the mask. After ablation, the volume previously occupied with solid material is usually occupied by air or a clearing gas, which has a much lower index of refraction than most solid materials. The result is a lowering of the effective index of refraction of the portion of the waveguide where ablation occurs. (Of course, a later deposition of material filling the removed volume can result in a later increase in effective index of refraction.) The laser ablation technique is applied to a portion of the material of the cavity that is prepared to lie at a surface accessible to the ablating beam, and that is traversed by optical energy circulating in the cavity. In FIG. 1, the laser ablation may be applied to the regions directly over the waveguides 122 and 124 between the heater electrodes 150 and 152, for instance, or between the heater electrode region and the tapered waveguide region, or in the region of the tapered waveguides 126 and 128, etc. When material is removed at these surfaces, the effective index is reduced for the mode that traverses the optical cavity underneath that surface, increasing the FSR. (The ablation technique may also be applied to the semiconductor diode laser in that GaAs is known to ablate, but there may be no large surface on the diode laser that is conveniently available for ablation without disrupting electrical contacts, passivation, or some other function.)

While the originally prepared surface of the material may be far from the optical mode, by proceeding with the ablation process, the desired deeper surface may be revealed. If a large change in effective index is required for a given resonator, the laser ablation process may proceed to a relatively greater depth, closer to the core of the waveguide where the mode intensity is highest. For a small change in effective index, a shallow laser ablation process is arranged.

Since a high accuracy may be required even when large changes are needed, multiple regions of ablation may be used. A deep ablation may be used to accomplish most of the correction, and a separate, shallow, ablation can be performed at a different location on the same resonator. The shallow ablation provides a small change in the effective index for a large exposure pulse, allowing high precision to be obtained in adjustments to the FSR. A further method of increasing the precision of adjustment is to reduce the extent of the spatial region exposed to the ablation beam.

FIG. 12C shows a further alternative method of FSR adjustment by adding material to the laser cavity. Methods that deposit material include the preferred evaporation process, and also laser induced chemical reaction sometimes called laser pantography, sputtering, and others. In the sputtering or evaporation approaches, the incoming beam 1284 that is directed onto the surface is a beam of particles, and the directing apparatus 1285 may be an electromagnetic director or a mask or baffle system. These methods can use standard equipment to deposit material uniformly at a controlled rate so that all of the free spectral ranges of all of the resonators on an entire wafer may be shifted simultaneously. These approaches proceed in a vacuum, and a vacuum-compatible FSR measurement approach is needed such as fiber coupling to external measurement apparatus. In the laser induced selective deposition technique, the incoming beam 1284 is a laser beam, and the directing apparatus is a focusing optical system that may or may not include a mask. The laser beam excites material at or near the deposition surface, inducing a chemical reaction near the region where the device is illuminated by the laser, and resulting in deposition.

Again, the spatial location of the portion of intracavity waveguide where the index modification is applied may be changed during the process. In the deposition method, the rate of change of index decreases with time until the location is changed to a fresh portion of the intracavity waveguide when the rate increases again. If the method chosen is to expose the material to radiation, the index change may saturate with time at a given location, and changing the location increases the rate of change of index at a constant exposure condition.

By illuminating the individual devices on a wafer separately by one of these deposition techniques, individual correction of the device FSRs may be achieved. Because of process variations, FSRs are likely to vary across a given wafer, and a spatially selective approach such as UV laser exposure may be preferable.

Frequency Selective Cross Connect

FIG. 13 shows a frequency selective cross connect device as another embodiment of the present invention that uses an athermal resonator configuration adjusted to coincide with predetermined frequencies, coupled to a waveguide via a tunable grating. The device 1300 may connect light from an input port to alternate output ports, depending on the frequency of the light. It may be used as a wavelength switch, as an add-drop device, as a detector, etc.

Waveguides 1322, 1324, and 1326 are fabricated on substrate 1370 from under cladding material 1344, core material 1340, and over cladding material 1342 as described elsewhere. Grating 1330 is fabricated in the parallel coupler region 1392 to form preferably a reflective coupler. As is well known, the propagation constants of the waveguides 1324 and 1322 are preferably different, and the wavenumber of the grating 1330 equals the sum of the propagation constants of the waveguides in the reflective grating configuration. In the alternative codirectional coupler grating configuration, the difference in the propagation constants is used, and the directions of the light flow as designated by the arrows 1325, 1306, and 1308 are reversed. The transverse profiles of the optical modes propagating in the waveguides 1324 and 1322 overlap each other in the region of the grating 1330, producing a coupling k1(λ) at the wavelength λ which is the fraction (in the absence of feedback around the waveguide 1324 which forms a resonator) of the power 1302 input in waveguide 1322 that is coupled into the waveguide 1324 in the sense shown by arrow 1325.

The waveguide 1324 comprises a closed loop, forming a resonator. Power in waveguide 1324 flows into the parallel coupler 1394 where the propagation constants of the waveguides 1324 and 1326 are approximately equal within a tolerance, producing a coupling k2(λ) of the 1324 waveguide power into the waveguide 1326. The wavelength dependence of the coupling k2 is much less than that of the coupling k1 in the absence of a grating in 1394. Alternatively, a second grating structure could be used in 1394 as described below in reference to FIG. 17. This coupled power exits waveguide 1326 at 1306. The remainder of the power in waveguide 1324 follows the closed path of waveguide 1324 back into the coupling region 1392, is partially reflective coupled back into the waveguide 1322. The power circulating in the waveguide 1324 is due to the interferometric sum of all the round trip electric field components and the input field of the input beam; the exit power 1304 is the interferometric sum of the transmitted remainder of the field of 1302 and the out coupled field from the resonator. The heater stripe 1350, connected to the two electrode pads 1354 and 1356, allows thermo-optic tuning of the grating 1330. A detector may be placed to measure the power 1306, in which case 1300 functions as a detector or receiver.

The resonator 1324 is preferably designed for a FSR that is a rational fraction of a communications channel spacing, it is adjusted in manufacturing both to equal the desired FSR and to adjust the longitudinal mode positions within tolerances, and it is designed to be athermal so as to provide an absolute frequency reference, independent of the heating of the grating 1330. The regions 1328 and if necessary 1329 are regions of modification of the index of refraction of the waveguide 1324 in order to achieve the desired FSR and longitudinal mode frequencies.

In view of the fact that the interaction between the two waveguides at the grating is preferably strongly dependent on temperature, the athermal requirement on the resonator presents some problems in its realization. In the preferred embodiment, these two seemingly contradictory requirements are met by designing the resonator waveguide 1324 to be athermal along every portion of its length, and by using a unique waveguide design shown in FIGS. 41C or 15. To retain tunability of the grating, the closely spaced waveguide 1322 is preferably made strongly temperature dependent.

FIG. 11B shows the preferred athermal design for the waveguide 1324. In contrast to the design shown in FIG. 11A where the overlap factor $\Gamma_c$ is large, in the cross section of the device 1110 in FIG. 11B, the overlap factor $\Gamma_c$ in the polymer layer 1142 is just small enough so that all of the layers together produce zero net change in optical length $n_{eff}L$ with temperature $$d(L\ n_{eff})/dT = 0 = d(L\Sigma_i\Gamma_i n_i)/dT = \Sigma_i\Gamma_i(L dn_i/dT + n_i dL/dT) \quad (10)$$

where $\Gamma_i$ is the overlap factor for the ith transverse portion of the waveguide traversed by the optical energy of the mode, and in this case the sum is taken at a given longitudinal position, over all the transverse portions of the waveguide. If for example, three materials are involved in the waveguide: polymer, cladding silica, and core silica, the sum is taken over these three regions. The waveguide index contrast and dimensions and layer thicknesses and etch depths are designed so that the polymer overlap factor $\Gamma_c$ takes on the correct value to produce a null in equation (10) within a tolerance. Any one of the electrodes in FIG. 11B may be used, but for thermo optic excitation a simple single electrode such as 1120 is preferred as a heater trace. In the preferred embodiment of the grating region 1330, the waveguide cross section is shown in FIG. 14C with the waveguide 1324 being the waveguide on the right with transverse mode 1481.

The preferred fabrication process for the devices 1100 and 1110 start the same. In both cases, a lower cladding 1144 of silica is fabricated on a silicon substrate 1170. A core layer is deposited, and the layers consolidated, patterned, and etched to form the ridge(s) 1140. In the case of FIG. 11A, layer 1142 is then spun on top, and the waveguide is complete. Because the polymer layer 1142 is close to the axis of propagation of the mode and the mode 1180 substantially overlaps the polymer layer ($\Gamma_p$ is large), this structure is a temperature tunable one with a relatively large change in $n_{eff}$ with temperature. The structure of FIG. 11A is suitable for the waveguides 1322, 122, 922, 1022, 1024, 1726, and the right hand waveguide of FIG. 15.

In the case of FIG. 11B, however, another layer, preferably of silica 1141 and of thickness comparable to the core layer thickness, is deposited and consolidated after patterning the core material 1140. To achieve a relatively small overlap factor, the layer 1141 is deposited with thickness in the range of 40% to 200% or more of the thickness of the core layer. Layer 1141 is then etched back by a fraction of its depth in the range of 0% to about 90%. The cladding layer 1142 is spun on and cured. Depending on the depth of the layer 1141 and the depth of the etch-back, more or less of the mode 1181 is revealed for propagation in the clad layer 1142. By adjusting these parameters, the overlap factor $\Gamma_c$ may conveniently be adjusted below the value obtained in FIG. 11A. If the deposited layer is thin, in the range from 5% to 40% of the core layer thickness, when the upper cladding layer 1142 is spun on, the overlap factor will take on an intermediate value.

To obtain an inherently athermal waveguide, since $(dn/dT)_{cladding}$ may be more than 20 times larger than $(dn/dT)_{silica}$, the overlap factor can be reduced to the neighborhood of 0.05 or lower, depending on the exact values of the thermo-optic coefficients. Where the condition (10) is satisfied in the waveguide, any longitudinal segment of it may be heated or cooled without affecting the resonator FSR. Transverse thermal gradients across the structures 11A or 11B are preferably avoided because they will introduce residual changes in the FSR and mode positions.

The waveguide 1322, is preferably designed according to FIG. 11A so as to obtain a large tuning rate with temperature. Exciting the heating stripe 1350 heats the grating region 1330 including segments of both waveguides 1322 and 1324. The effective index of the guide 1322 changes rapidly, tuning the grating wavelength. The effective index of the adjacent guide 1324 remains constant and independent of temperature, so that the longitudinal modes of the resonator are substantially unaffected. To maintain the coupling ratio of the coupling region 1394 independent of temperature, the waveguide 1326 is preferably designed the same way as the waveguide 1324.

The reflection band of the grating 1330 is preferably narrower than the communications channel spacing. The power transferred from the waveguide 1322 to the waveguide 1324 depends on both the grating assisted coupling function k1(λ) and the resonator spectrum. The longitudinal mode of the resonator with the largest coupling value is most strongly excited. For the structure 1300 to act as a frequency selective detector, the coupling function should be strong at the selected frequency(ies) and small at the adjacent (or all the other deselected) longitudinal modes. A preferred suppression would be greater than about 30 dB. To accomplish this suppression, the bandwidth of the grating coupler is preferably narrow so that when the grating is tuned to reflect at one of the longitudinal modes, the coupling function is very weak at the other longitudinal modes. The grating is also preferably apodized and/or chirped and otherwise engineered to accomplish this objective.

The grating 1330 couples a frequency into the waveguide 1324, but if the resonator formed by 1324 is off resonance, the multiple passes around the resonator add up out of phase and suppress the coupling. As the grating 1330 is tuned through a resonance of the cavity, the multiple passes add in phase and the coupling is enhanced. There is significant power coupling with the resonator 1324 only on the frequencies defined by the resonator, despite analog tuning of the coupling grating. Power is coupled out of the waveguide 1322 one selected frequency at a time, digitally, with strong suppression at intermediate frequencies. A fraction of the power circulating in the waveguide loop 1324 is coupled into the waveguide 1326. With a detector coupled to the power 1306, the device 1300 becomes a tuned detector that can be switched between preselected channels by controlling the current flowing through the heater 1350. The remainder of the power flows transparently through the waveguide 1322 and into the output 1304. If the device 1300 is an add/drop device, the output 1304 is connected to the continuing fiber in the transmission system, with the non-selected frequencies passing through with insertion loss but otherwise essentially unchanged. If the device 1300 is a tuned detector, the output 1304 is preferably coupled to an absorber and/or an angled reflector and/or diffractor to ensure that there is no return signal.

Impedance Matching

If the coupling coefficient from the waveguide 1322 into the resonator formed by 1324 is properly impedance matched at a specific frequency, all of the power 1302 at that frequency will flow through the resonator and into the port 1306 with no power leaking through to 1304. When the resonator is excited on-resonance, the electric field amplitude coupled in 1392 out of the waveguide 1324 into waveguide 1322 is exactly out of phase with the remaining input power from 1302 that transmits directly through the grating coupler 1330 in waveguide 1322 into the output 1304. Perfect impedance matching is obtained when the resonator loss and the coupling strength are adjusted so that the amplitudes of those two waves are identical, resulting in perfect cancellation and zero power flow into the output channel 1304. With perfect impedance matching, all of the input power from 1302 flows into the resonator and is partitioned between the output 1306 and the dissipative losses of the resonator 1324. If the resonator is imperfectly impedance matched or if it is excited off resonance, some of the power input at 1302 at that frequency will be passed through to the output 1304.

The desired situation is to impedance match the coupler 1392 so that at the predetermined frequency of the resonator that is selected by the tunable grating coupler, all the input power flows to the output 1306. At all other frequencies not selected by the grating, the input power flows transparently to the output 1304.

Perfect impedance matching can be designed once the dissipative loss of the resonator is known, by choosing the resonant coupling constant in coupler 1392 and the coupling constant of coupler 1394 to meet the stated criterion. For efficient operation, the coupling in 1394 should preferably equal the dissipative losses or exceed them by a factor of two or so. This leaves the coupling in the coupler 1394 as the main free variable that is used to achieve perfect impedance matching. In manufacturing, as before, perfect impedance matching will not always be obtained of a large enough fraction of the production. A method for trimming the impedance matching is needed for increasing the yield. It is possible to adjust the coupling constant of the parallel couplers 1392 and/or 1394 and/or the loss of the resonator waveguide 1324 to achieve perfect impedance matching.

The coupling constant in the couplers depends on both the transverse mode overlap between the two waveguides in the coupler, and on the strength of the grating. In trimming the couplers, it is convenient to measure a crosstalk quantity during fabrication of the grating and to adjust the grating strength to minimize that crosstalk. For example, if the selected crosstalk quantity is the power feedthrough on-resonance power feedthrough to 1304 from 1302, the ratio of these powers may be measured and minimized to produce good impedance matching. This step is preferably done after the waveguide is fully fabricated, i.e. after the cladding layers are deposited. If the grating is formed by exposure to an energetic beam such as visible or ultraviolet light, the exposure may be adjusted until the crosstalk quantity lies below the desired threshold. For example, UV exposure of the Ge-doped silica core can be performed by illuminating the core through a fully cured polymer cladding layer using the interfering beams approach or possibly a phase mask. Or, exposure of a sensitized polymer cladding layer can be accomplished by the same means. With good impedance matching, the power at the resonance frequency that leaks through to 1304 can be reduced to a desirably low value such as −30 dB, for instance.

For example, a test beam may be injected into the waveguide 1322 providing an input signal 1302, and a detector placed to be sensitive to a portion of the light exiting the waveguide 1322 as output signal 1304. The ratio of these two signals at the frequency of resonance is a type of crosstalk called the extinction ratio. This may be done before or after slicing and dicing of the wafer into individual chips. By measuring the fraction of the input signal 1302 that emerges as an output signal 1304 while the exposure of the grating 1330 is proceeding, the total exposure required can be predicted, and the exposure stopped before reaching an over-exposed condition. By remeasuring the extinction ratio, a small increment of exposure may be calculated and applied to nudge the impedance match to the desired optimum. As an alternative, the add-drop crosstalk may be measured at a resonant frequency as the ratio between the output into channel 1306 when the input 1308 is excited, or vice versa.

The transverse mode overlap between the two waveguides may be adjusted by small amounts by changing the index of refraction of the region between the waveguide cores. Again, UV exposure of either a sensitized silica region or of an incompletely cured polymer region between the cores can accomplish this objective. This approach has the advantage that it may be applied independent of the mechanism chosen to fabricate the grating.

The resonator loss may be increased by several methods. Provided that the coupling into the resonator in the grating 1330 is designed to slightly exceed optimum, the resonator loss may be increased to bring the device to optimal impedance matching. The resonator loss may be increased by laser ablation or wet or dry etching over a portion of the waveguide 1324, for instance, gradually bringing a somewhat roughened surface closer to the core of the mode in the resonator and increasing the optical loss due to factors such as diffraction, scattering, and mode coupling loss. Alternatively, an index of refraction discontinuity may be created transverse to the waveguide by laser ablation or by UV irradiation of sensitized silica or polymer, creating a reflection or diffraction loss. A shallow angle interface can reflect a large amount of light with even a small index change. Other approaches are also possible such as by doping a photo chromic molecule into the resonator to produce changes in absorption upon exposure. Or, a surface absorption loss may be introduced for example by depositing a metallic film near enough to the waveguide core to produce some optical loss. The loss induced by this film may be controllably trimmed away by e.g. laser ablating portions of the film, thereby also adjusting the resonator loss.

Note the desirable fact that if the grating drifts slightly in center wavelength, the transmission spectrum of the output beam 1306 is little changed. The effect of drift shows up as a change in the side mode suppression, and as a reduction in efficiency of power transfer to the output leg 1306 (reducing the detection efficiency of a detector mounted to receive the power 1306).

When the cavity is athermal, the grating coupler is tunable, the FSR and one of the modes has been frequency adjusted, and the impedance matching is complete, the device 1300 may be used as a digital wavelength selective cross connect. A multiple frequency (DWDM) input may be connected as 1302, and selected ones of the frequency channels may be redirected from 1304 to 1306 with good efficiency and low crosstalk. The device 1300 is essentially transparent at the other frequencies.

An additional input port allows power to enter the system at 1308. By symmetry and time reversal invariance, if the coupler 1392 is impedance matched at a given frequency from the input 1302 into the output 1306, then the coupler 1394 will also be impedance matched at the same frequency from the input 1308 into the output 1304. This means that when the device is tuned to efficiently drop a channel into 1306, it is also tuned to efficiently add a channel from 1308 to 1304. Data at the optical frequency of coupling determined by the grating 1330 and its actuator 1350 may therefore be dropped out of 1302 and added into 1304, substantially independently if the crosstalk is small, and without affecting the other frequency channels of the system.

The waveguide 1324 forms a resonator. Light makes multiple round trips before decaying away due to losses and coupling out of the resonator. The multiple round trips interfere with each other, producing the characteristic FSR and longitudinal mode spectrum already referred to, along with the phenomena of impedance matching. This situation is in marked contrast with the situation in which a totally reflective grating is placed in the coupler region 1392. In the high reflector grating case, light 1302 enters the waveguide 1324 after one reflection from the grating 1330, makes a single pass around the loop 1324, and exits as light 1304, without substantial interference from multiple round trips in the loop 1324. The functioning of such a high reflective grating device would be essentially the same whether or not the waveguide 1324 forms a resonator. This high reflector grating case is described in A. S. Kewitsch, U.S. Pat. No. 5,875,272, Feb. 23, 1999. Without interference, the useful longitudinal mode resonances disappear.

The waveguides 1322 or 1326 may be coupled to other devices, including fibers, amplifiers, switches, reflectors, filters, modulators, sources, and detectors. In particular, 1326 may also be a communications waveguide carrying multiple optical frequency channels that enter at 1308. In the configuration of FIG. 13, the resonator 1324 is coupled simultaneously to substantially all these wavelengths since the coupler 1394 is a broadband coupler. Light input into 1308 with the frequency selected by the grating 1330 will be transferred into the output 1304. In this configuration, the device 1300 acts as a channel-selective cross-connect switch, with only the selected frequency (or frequencies, depending on the grating design) being switched from 1302 to 1306 and from 1308 to 1304, and all the other frequencies passing through. However, as shown, the waveguide 1326 is not as transparent as the waveguide 1322 because the coupler 1394 is broadband, and couples many frequencies into the resonator 1324, whereas the coupler 1392 is narrowband and may couple only one frequency into the resonator. Although the frequencies that are coupled from waveguide 1326 into the resonator may not be coupled into the waveguide 1322 if the grating is off resonance, there will still be distortion in 1326 at the coupling frequencies, such as pulse distortion and additional power loss.

FIG. 17 shows another embodiment 1700 of the invention in which the coupler 1794 is also fabricated as a narrowband coupler comprising elements similar to those of coupler 1392. A thermo-optic grating 1730 and heater stripe 1750 are provided as described. The waveguides 1324 and 1726 have dissimilar mode propagation constants, and preferably dissimilar thermal coefficients as described in relation to FIGS. 14C or 15. Waveguide 1726 is fabricated in the same way as waveguide 1322. The input 1708 and output 1706 have reversed position from FIG. 13 since the grating coupler in 1794 is reflective. The functioning of the device 1700 may be almost identical to that of the device 1300 except that the waveguide 1726 is now transparent at the frequencies away from the grating resonance(s). The inputs 1708 and 1302 may be symmetric, as for the outputs 1706 and 1304. To couple a specific frequency across the resonator from 1302 to 1706 or from 1708 to 1304, both gratings 1330 and 1730 are typically tuned to the desired frequency. Multiple optical frequency channels may be present on both 1302 and 1708, and the data on a specified channel is interchanged when both gratings are tuned to that frequency. The device 1700 therefore may act as a frequency selective cross connect or optical switch, including the subset functions of add-drop and tuned detector. The two gratings 1730 and 1330 may be tuned simultaneously by the same heater current, but there are advantages to being able to tune them separately.

By cascading multiple devices such as 1700 or 1300 along a single input channel 1302 (connecting 1304[i] to 1302[i+1]) multiple optical channels may be independently dropped into multiple output channels 1706[i] or added from multiple input channels 1708[i]. By cascading multiple devices such as 1700 or 1300 along two input channels (connecting 1304[i] to 1302[i+1] and connecting 1708[i] to 1706[i+1]), multiple optical channels may be independently cross connected between the two fibers each carrying multiple data channels.

The devices 1300 and 1700 are reconfigurable since they may be changed from acting on (i.e. cross-connecting) channel i to acting on channel j. It may be desirable, when tuning the device 1700 from channel i to channel j, to avoid acting on the intermediate channels that lie between channels i and j. If channels i and j are separated by active communications channels carrying data, it is essential to avoid significantly perturbing or "hitting" the data transmission in those active channels when tuning a device from cross-connecting channel i to cross-connecting channel j. The device 1700 offers a unique way to avoid hitting the intermediate channels. The two gratings 1330 and 1730 may be tuned at different times or different rates so that their frequencies do not overlap at the intermediate channels but only at the desired end channels. If the two grating responses do not overlap, impedance matching is not obtained across the resonator, and the interaction with an intermediate channel while tuning across it is greatly diminished: no light will be added, dropped, or switched. (There will be a perturbation due to the coupling into the resonator 1324, but if the tuning is accomplished slowly, this perturbation may be negligible.) To tune from channel i to channel j, for instance, one grating may be tuned first, and then the other. The action on channel i will cease as soon as the first grating is detuned, and the action on channel j will not begin until both the first and the second gratings are tuned to channel j. Or in another example, the two gratings may be detuned relative to one another by a desired amount to stop the action, after which the detuned pair is tuned across to the desired channel where they are retuned into coincidence with each other.

FIG. 18 illustrates a vernier method of extending the tuning range by using multiple grating peaks. The longitudinal modes of the resonator 1324 are shown as a function of frequency by the multipeaked curve 1810 where the width of the resonances has been shown to be very small for simplicity. We assume that any birefringence has been compensated so that the curves for the two polarizations overlap. The resonator FSR 1814 is the separation between adjacent peaks of the curve 1810. The two gratings 1330 and 1730 each have multiple peaks, as shown by the curves 1820 and 1830, respectively, which each have five peaks. The peaks of the gratings are essentially equally spaced, but the peak spacing in one grating may be larger than that of the other grating by the frequency 1812, which in FIG. 18 is equal to twice the FSR. For the tuning shown in FIG. 18, a pair of grating peaks 1823 and 1833 coincide in frequency. By tuning the pair of gratings together over the range 1840 (7 FSR), eight adjacent longitudinal modes 1852 may be selected. If the FSR equals one communications channel separation and the modes 1810 overlap the channels as described, eight successive communications channels may be selected by the device 1700.

When one spectrum e.g. 1830 is detuned relative to the other by a certain amount, in this case by one FSR, none of the modes overlap, and no mode is active in the device 1700. The frequencies of the two spectra may be tuned together in this condition without dropping or switching any of the channels. By tuning the spectrum 1830 of the grating 1730 by two FSR increments to lower frequency, the second pair of grating peaks 1824 and 1834 may be brought into coincidence. The next eight successive channels 1854 may be selected by again tuning the two gratings together over the range 1840, relative to the starting point where the grating peak 1834 has been adjusted to overlap 1824. It apparent clear that by tuning the spectrum 1830 by either 0, ±2 FSR, or ±4 FSR, and by tuning the pair of spectra 1820 and 1830 together over the range 1840, a total of at least 5×8=40 sequential channels 1850 may be addressed. The required tuning is only about 16 FSR, including the initial tuning required to superpose the grating peaks 1823 and 1833 on the desired channel. The number of channels that can be addressed for a given tuning range has been increased by the use of this vernier method at the expense of the additional channel perturbation caused by the additional grating peaks, which is preferably made small.

If it is desired to jump between noncontiguous tuning ranges, such as from the range 1852 to the range 1856, the intermediate modes such as 1824 and 1834 must be made to overlap somewhere. If intermediate channels are in use for data transmission for example, so that they cannot be hit, the tuning may be adjusted so that the modes 1824 and 1834 overlap at intermediate frequencies such as in between longitudinal modes 1810. Provided that the grating spectra of the peaks 1824 and 1834 are narrow, the coupling by the gratings into or out of the resonator 1324 can be made small.

Many variations of this approach may be used. If the grating peaks are narrow enough, the frequency interval 1812 may be smaller than two FSRs, allowing use of additional grating peaks. If the tuning range covers more (or less) than eight channels, the tuning range may also be increased (or decreased). Unequally spaced peaks may be used, etc. As a further alternative, the device 1300 or 1700 may be combined with a pair of optical switches on either side and a bypass waveguide that route an optical input either through the device or around it along the bypass waveguide to an optical output in an arrangement known in the art as a hitless switch, so that the optical transmission may be switched to bypass the device during the tuning of the grating 1330.

Differential Waveguide Thermal Response

FIGS. 14A and 14B are two intermediate stages in the fabrication of the embodiment of FIG. 14C which contains a pair of adjacent waveguides fabricated with different (preferably thermo-optic) coefficients. The first steps of fabrication of such a structure preferably involve the deposition of a cladding layer 1444 followed by a core layer with higher index of refraction on a substrate 1470. As described previously, this structure is preferably fabricated from silica on a silicon wafer, with Ge doping for the core, but many variations are available. The core layer may then be patterned, producing the twin parallel ridge structures 1440, seen in cross section end-on. The top cladding 1441 is then applied and an etch mask layer 1443 is deposited and patterned to reveal only one of the two waveguides along a desired portion of its length. FIG. 14A shows the semi-processed article at this stage in its fabrication. An etching step such as RIE is now applied to remove some of the silica cladding in the regions not covered by the mask, resulting in the structure of FIG. 4B. After removing the mask material of layer 1443, a thick polymer cladding layer 1442 is spun on, and an electrically conductive layer may be deposited and patterned to form the electrode structure 1445, resulting in the device of FIG. 14C. Additional layers of electrodes or additional waveguide cores, gratings, and other components may optionally be fabricated either on top of, in, or below this structure.

In the case of the grating coupler 1392 or 1794 for instance, it is desirable to fabricate a grating such as grating 1330 in the layer 1441 between the two core regions 1440 (or in another portion of the structure traversed by optical modes 1482 and 1481). This grating may be fabricated at several alternative times during an overall process sequence, including before depositing the layer 1443, and after applying the layer 1442. It is apparent from FIG. 14C that the mode 1482 has a much larger overlap factor in the layer 1442 than the mode 1481. If desired, the waveguide design and the layer characteristics including thickness may be adjusted so that the mode 1481 has no net temperature dependence of its effective index of refraction (all such conditions are met within a tolerance). Then the mode 1482 of the adjacent waveguide has a net negative thermal tunability while its partner is athermal, as called for in the preferred design of the devices 1300 and 1700. If desired the temperature dependence of the two waveguides may also be realized as equal and opposite by further reducing the overlap factor of the modes in the negative thermo-optic coefficient material 1442. Other variations are also possible including making the mode 1482 athermal, in which case the mode 1481 has a positive thermal coefficient.

In a different embodiment, the layer 1442 is an electro-optic, and the element 1445 is an electric field applying electrode. In this case the change in effective index with applied field is different for the two waveguides 1440 and for the two modes 1481 and 1482. As before, an electrode configuration similar to that of FIG. 11B may be preferred for electro-optic devices.

FIG. 15 shows an alternative embodiment of an adjacent pair of waveguides with different coefficients. The fabrication technique involves a variation of the fabrication technique described in reference to FIGS. 11A and 11B, but with the addition of a masking step, an etch step, and another deposition step. An adjacent pair of waveguide cores are fabricated as described e.g. with reference to FIG. 11A. A cladding layer 1544 and a core layer 1540 are deposited on a substrate 1570. The core layer is patterned to form the twin waveguide cores shown in FIG. 15, and cladding layer 1542 is deposited. A mask layer may be applied above the layer 1542 and patterned in the same way as described in reference to the mask 1443 in FIG. 14A, to reveal only one of the two waveguide cores along a portion of its length. An etch process is applied to remove the layer 1542 where it is exposed by the mask as shown on the right side of FIG. 15. This step is preferably a selective etch so that all of the layer 1542 is removed where exposed, without substantial removal of the silica layers 1544 or 1540. A final layer 1546 is applied, producing the structure of FIG. 15. Optionally, the surface may then be planarized. In the case of FIG. 15, the modes that propagate in the two different cores may have different thermal coefficients because of different thermal characteristics of materials used for the layers 1542 and 1546. If, for example, a heavily cross linked polymer is used for layer 1542, and a lightly cross linked layer of a similar polymer is used for layer 1546, all other things being equal, the mode with the larger overlap factor in the more lightly cross linked material 1546 will have the stronger thermal coefficient (assuming the thermal coefficient is dominated by the layers 1542 and 1546). Or, if the operating temperature is well below the glass transition temperature Tg of the polymer 1542, but well above the Tg of the polymer 1546, the mode with the larger overlap factor in the above-Tg material 1546 will have the larger (negative) thermal coefficient. As an alternative in any of the above, if a layer such as 1542 is itself photosensitive, an additional masking layer may be omitted, and the layer such as 1542 may be patterned directly by exposure and development to form the desired patterned structure.

In the implementations of the invention described herein, a liquid crystal material may be used to change the index of refraction of a waveguide. For instance, layer 1546, or 1442, or 1142, or 842, or 742, or 342 or other layers traversed by the optical mode within the grating region may be a liquid crystal material of one of the many types known in the art. A particularly convenient case is that of the polymer dispersed liquid crystal (PDLC), which may be considered an electro-optic material since the index of refraction changes with applied field (although the response time is relatively slow compared to electro-optic crystals, for example). Take for example the case of FIG. 11B where layer 1142 may be a PDLC. Electrodes 1122, 1124, and 1126 are provided to produce electric fields with controllable vertical and horizontal components. An upper cladding (not shown) may also be used to increase the voltage breakdown threshold between electrodes on the same surface such as 1122 and 1124. When electrodes 1122 and 1124 are excited to the same polarity different from 1126, a substantially vertical field is produced in the vicinity of the waveguide, lining up the liquid crystal material in the PDLC in the vertical direction. When electrodes 1122 and 1124 are excited to opposite potentials and 1126 is at ground potential, a substantially horizontal field is produced in the vicinity of the waveguide core, lining up the liquid crystal material in the PDLC in the horizontal direction. The index of refraction of the PDLC and the effective index of the waveguide is substantially different in the two cases for any component of polarized light (either TE or TM) in the waveguide. The index of refraction may be varied continuously by changing the potentials to the electrodes appropriately between the two extreme situations described above. If a grating has been fabricated along the section of the waveguide with PDLC (such as in the core material 1140, or in one of the cladding materials 1144, 1141, or 1142 within the optical mode 1181), the interaction of that grating will be tuned by applying fields as described. Note that the waveguide structure of FIG. 11A is preferably used to obtain a large tuning range, but the electrode structure of FIG. 11B is preferably used to tune the PDLC. The polymer matrix of the PDLC is also preferably selected to approximately index match with the liquid crystal materials near an operating condition, to reduce losses.

A PDLC is a convenient type of liquid crystal material to use in this application because it does not require confinement, the confinement of the liquid crystal droplets being by the polymer of the PDLC. However, PDLC has the disadvantage of relatively large optical scattering, depending on the indices of refraction of the aligned liquid crystal droplets and the polymer matrix. More standard liquid crystal materials may also be used. With these latter materials, a confinement structure is preferably provided. The electrodes 1120, or if needed electrodes 1122 and 1124 may be provided on the top plate or on the additional layers, or otherwise disposed spatially to create the desired electric fields. Alignment layers for the liquid crystal materials and electrodes can be provided to actuate the liquid crystal material as is known in the art. Electrodes may alternatively be provided longitudinally arranged along the waveguide with the electric field parallel to the guide. Transparent electrodes as known in the art may be used to diminish optical losses if a significant portion of the optical mode traverses the electrode material. Excitation of the electrodes change the index of refraction of the liquid crystal material, either to increase or decrease the index of refraction, depending on the arrangement of the initial voltage and/or the alignment layer that establishes molecular alignment in the absence of an applied field.

The athermal resonators described herein provide a useful function in themselves, even without any tuning function. For such devices, the heater stripes may be omitted, and the grating elements may be fabricated in athermal waveguides to accomplish temperature independent frequency selective devices. For example, the devices of FIGS. 1, 9, and 10, may be used as fixed frequency laser sources, and the devices of FIGS. 13 and 17 may be used as fixed-frequency cross connects or as fixed frequency detectors or add-drop devices.

In another alternative embodiment, all of the elements of the structure are integrated onto a single substrate. If the substrate is InP, the laser structure can operate in either the 1310 nm region or the 1550 nm region; other substrate materials enable other wavelengths. In all cases, a polymer material may be integrated into a portion of the optical cavity along the waveguide, and a frequency selective structure may be used to determine the operating frequency. The polymer structure may be tuned to produce an athermal free spectral range, the FSR may be adjusted to equal a rational fraction of a communications channel spacing, and the grating may be tuned by a polymer section.

Tapered Coupling

FIG. 3 shows the preferred embodiment of a hybrid integrated coupling apparatus including a taper, but ignoring other complexities such as the waveguide bends of FIG. 5. A simple taper described for example in * HG. Unger, U.S. Pat. No. 4,415,227, Nov. 15, 1983 is often insufficient for coupling single mode waveguides with largely different mode dimensions. The normalized propagation constant V of a waveguide helps determine its modal behavior:

$$V = k_o T/(n_f^2 - n_s^2), \tag{11}$$

where ko=$2\pi/\lambda$, T is approximately equal to the smallest transverse dimension of the waveguide, $n_f$ is the index of refraction of the core layer of that waveguide, and $n_s$ is approximately the index of refraction of the underlying layer adjacent to the waveguide. If for example one of the waveguides operates in the middle of the single mode region with a normalized propagation constant V=2.5, a factor of two up-taper will result in multimode behavior. On the other hand, a down taper of such a waveguide is not effective in reducing the mode dimensions. Our problem is to match a small, high-contrast single mode waveguide in a semiconductor diode laser to a larger, low contrast single mode waveguide in a planar waveguide chip. We wish to fabricate the taper on the more easily manufactured passive waveguide substrate. We have designed a three-waveguide approach where we use a third material of index of refraction intermediate between the indices of either the small or the larger waveguides, and we use an extreme taper that drives the third waveguide below cutoff for the operating wavelength.

The cutoff of a waveguide is defined as the parameter value of interest (e.g. wavelength, width, effective index, etc.) past which the transverse confinement of the mode is lost and energy propagates away from the core transverse of the propagation axis of the guide. The cutoff situation is to be distinguished from the coupling between well defined waveguides where energy is exchanged between well defined (otherwise below cutoff) waveguides.

Diode laser chip 310 contains a waveguide section 320 fabricated on a substrate 314. The laser chip 310 provides net amplification around a range of wavelengths such as 1552 nm. The diode laser chip 310 has dimensions that are selected according to the wavelength and material system and might be 500 microns thick, 400 microns long in the direction of the waveguide, and 400 microns wide, for a 1550 nm laser. The rear facet 312 forms one end of the laser cavity. The laser lases along the optical axis 324. The other end of the laser cavity may be inside the waveguide 340 at the location of a retroreflecting grating (see 130 or 132 of FIG. 1). The dimensions of the waveguide section 320 are variable but may typically be about 0.7 microns in the y direction, and about 2.1 microns in the x direction, with an optical mode size of perhaps 0.55 microns and 1.65 microns, respectively. We typically quote the mode size as the $1/e^2$ half width of the intensity. The full width of the mode is about twice the mode size, and the full width at half maximum of the beam is about 1.18 times the mode size. The laser propagation axis 324 along the waveguide 320 is fixed at a vertical distance 325 above the laser substrate 314, in preparation for bonding and alignment onto the substrate 370.

The laser is preferably attached to the substrate with solder as shown in FIG. 3. The laser lower surface is prepared with an adhesion layer 352, a barrier layer 354, and a cap layer 356. Note that the laser chip is upside-down in FIG. 3 since the substrate 314 is to the top of the figure. The adhesion layer is preferably 0.1 microns of Ti, the barrier layer 0.4 microns of Pt, and the cap layer 0.1 microns of Au. The bonding surface of the substrate 370 may be prepared in a similar way with an adhesion layer 358, a barrier layer 360, and a cap 362. The solder layer 350 is prepared on the cap layer of the substrate for convenience, and may be fabricated from a few microns of AuSn solder with a melting point of about 280° C. The laser waveguide may be aligned in the x-z plane, pressed down into place, and the solder heated for a short time in an appropriate gas such as formic acid to prevent the formation of oxides and to allow the laser chip to bond. Notice that the thicknesses of the solder layer 350 and the other layers are controlled so that the laser substrate 314 after bonding has a desired vertical separation 326 from the waveguide substrate 370, within a tolerance for good optical coupling. Since the laser waveguide 320 lies a fixed distance above the laser substrate 314 according to the process sequence in the fabrication of the laser, and the waveguide 330 lies a fixed distance 335 above the waveguide substrate 370 according to the process sequence in the fabrication of the waveguide 330, it follows that by controlling the bonding layers 350, 352, 354, 356, 358, 360, and 362 and the bonding process, we can adjust and control the relative vertical positions of the waveguides 320 and 330 by adjusting and controlling the separation between the two substrates 314 and 370. Within the vertical tolerance, the vertical separation 326 may be adjusted to equal the sum of the vertical height 325 of the waveguide 320 and the vertical height 335 of the waveguide 330.

The waveguide 340 fabricated has dimensions chosen to optimize other factors including the efficiency of coupling to standard optical fiber, the fraction of the mode that propagates in the cladding, and the propagation loss through structures including bends. While again the dimensions of this waveguide may vary by a factor of three to ten or so, depending on these factors and fabrication factors such as index difference, we have chosen commercial silica technology for waveguide 340 with a preference for a waveguide dimension of 2 microns by 2 microns with a 2% index difference core-to-clad.

The disparity in the dimensions of the two waveguides 320 and 340 would result in a high coupling loss if waveguide 320 were to be butt coupled directly to waveguide 340 (close to 4 dB), even with perfect alignment. In the hybrid grating laser, this loss is intracavity and will increase the threshold and reduce the output power. The tapered waveguide section 330 is preferably provided to improve the coupling efficiency to better than 3 dB and preferably less than 1 dB or even 0.5 dB. Waveguide 330 is preferably butt coupled to waveguide 320, and parallel-coupled to waveguide 340 with a special taper that drops the effective index of the tapered waveguide 330 below cutoff. Ideally, the input end 332 of the waveguide 330 is designed so that the transverse dimensions of the lowest order optical mode propagating in the input segment of 330 are equal to or near the transverse dimensions of the lowest order optical mode emerging from the diode laser waveguide 320. By providing an index matching material in the gap between the two waveguides, the Fresnel reflections and optical scatter from the two waveguide ends can also be minimized. FIG. 3 shows that the waveguide 330 is preferably fabricated directly on top of the waveguide 340, but in an alternate design may be below it or separated by additional layers.

The tapered portion of the waveguide 330 brings the propagation constant of waveguide 330 close to that of the waveguide 340 allowing energy to couple between the waveguides. The taper continues until the waveguide 330 goes below cutoff. Light propagating out of the laser waveguide 320 is butt coupled into the end of the tapered waveguide 330; in the down-tapered region it is in turn transversely coupled into the parallel waveguide 340. Light returning from the opposite direction in waveguide 340 is transversely coupled into the same portion of the waveguide 330 which is now up-tapered for light propagating towards the laser, whereupon it is butt coupled into the waveguide 320 of the diode laser chip. The waveguide 340 is fabricated from a material with index of refraction $n_2$. The surrounding materials have lower indices close to and possibly identical to that of silica $n_1$. The strength $\Delta$ of the waveguide 340 depends on the local transverse dimensions, the index of the cladding 342 if different from that of silica, and the index difference $$\Delta_{340}=(n_2-n_1)/n_1 \qquad (12)$$

Depending on these parameters, the waveguide 340 will guide a lowest order optical mode that has an effective index of refraction $n_{eff}$ that lies approximately in the range $n_1 < n_{eff} < n_2$.

FIG. 4 illustrates the changes in index of refraction produced by the operation of the taper. For the waveguide 330 to function, its index of refraction $n_3$ is larger than $n_2$. As shown in the region 460 in FIG. 4, the $n_{eff}$ 430 of the first segment of the waveguide 330 is larger than the $n_{eff}$ 440 of the first segment of the waveguide 340. A taper reduces the strength of the waveguide over the region 470, lowering the $n_{eff}$ 430 and changing the mode shape. The taper can be accomplished by varying the local transverse dimensions and the index difference, but it is easier to vary the lateral width of the waveguide by changing the mask used to determine the waveguide pattern during fabrication. While the waveguide 330 is still relatively strong, the taper can be rapid, as shown in the region along the z axis of extent $T_1$ in FIGS. 3 and 4. However, as the taper progresses, the mode of the waveguide 330 begins to couple with the modes of the waveguide 340 in the coupling region 450.

Coupling will be strongest with the lowest order mode of the waveguide 340 because their effective indices are closest. Energy exchange occurs over a limited region 450 in z where the two mode indices approach each other, and where the respective indices acquire an imaginary part. Looking at the propagation direction of increasing z, as the taper progresses, the two modes perturb each other more strongly, and the coupling becomes stronger. Eventually the mode of the waveguide 330 disappears (below cutoff), the imaginary part of the index returns to zero, energy exchange ceases, and the perturbation of the lowest order mode of waveguide 340 disappears. To accomplish an efficient transfer of energy from waveguide 330 into waveguide 340, it is desirable to accomplish the taper slowly while the modes couple, allowing sufficient interaction time for completion of energy exchange. The region $T_2$ is typically longer than the region $T_1$ for this reason.

There are many choices to be made in selecting a particular waveguide and taper design. Materials for the upper and lower waveguides are preferably stable, easily processable, and compatible. Even within a given choice of materials set, there remain many options and several degrees of freedom. The preferred taper design for this application uses a silica ($SiO_2$) materials system for the waveguide 340 and lower cladding 344, and a tantala ($Ta_2O_5$) core for the tapered waveguide 330, with a polymer top cladding 342.

For the upper waveguide 330 we choose tantala because of its stability, low loss, and high index $n_3=2.03$ at 1.55 microns. Note that the exact index of refraction depends on the process used to deposit the film. Since the taper characteristics depend sensitively on the index, all of the numbers quoted here are calculated for $n_3=2.03$, but are preferably adjusted experimentally to obtain the desired performance for a given manufacturing process. The vertical dimension of the input end 332 of the waveguide 330 is preferably chosen to be about 0.08 micron (in the y dimension), producing a very weak vertical guide with a vertical mode size of about 0.8 microns that approximately matches the vertical dimension of the guided mode in the diode laser. The lateral dimension is preferably about 2 microns (in the x direction), producing a lateral mode size of about 1.3 microns, close enough to the diode laser mode size of about 1.65 microns. The effective index of this guide is preferably just slightly above cutoff, at approximately $n_{eff}=1.49$, so that the mode full width is substantially larger than the core dimensions, particularly in the vertical direction. The length of the initial taper may be short, in the region of $T_1=100$ microns or so, and the majority of the taper may be accomplished here, reducing the width of the waveguide by a factor that may be 2 or even 10 or more, depending on the specific design. The exact length and amount of taper in this region can be adjusted experimentally to optimize the amount of mode size reduction while minimizing the optical loss (the length $T_1$ can be increased to reduce the optical loss). Most of the taper but essentially no coupling is preferably accomplished in this rapid taper section. The second taper may be longer such as $T_2=500$ microns or so, and sufficient taper is provided to initiate the coupling between the modes, to carry the upper waveguide mode below cutoff, and to decouple and substantially reduce the perturbation of the lower waveguide. It may be sufficient to taper this portion of the guide by 50%. Again, the exact length and amount of taper in this region may be adjusted experimentally to optimize the amount of energy transfer between modes (the length $T_2$ can be increased to reduce the optical loss). The initial untapered portion may be very short or even of zero length, or multiple tapered sections may be provided.

The preferred taper design uses a 0.08 micron tantala thickness and a single taper (i.e. $T_1=0$) in which the lateral waveguide width is tapered down from 2 microns to 0.7 microns over a distance $T_2=600$ microns. As the mask width becomes smaller than about 1 micron, factors such as lithographic resolution and mask undercutting make it increasingly difficult to reproduce small features. Although the mask provides taper in the lateral dimension, the process of reproducing the mask and defining the waveguide width will provide both somewhat narrower lateral features than 0.7 microns, and a natural vertical taper that is more pronounced at the small end of the waveguide 330. For this reason, the effects of the fabrication equipment on the function of the taper should preferably be taken into account, and the dimensions adjusted accordingly. Indeed, this fact may be made use of in the design to realize a lower effective index at the thin end of the waveguide than is called for in the mask design. At the end of the taper, the waveguide 330 may be terminated abruptly because the waveguide 330 is below cutoff and very little optical energy remains in the region of the core. Alternatively, the mask taper may be continued to zero width, allowing the lithographic process to terminate the waveguide naturally.

FIG. 8 shows an alternative taper design in which segmentation is included in the design of the waveguide. A substrate 870 is prepared with a waveguide core 840 of index $n_2$, upper cladding 842 of index approximately $n_1$, and lower cladding 844 of index $n_1$. The waveguide core 840 has higher index of refraction than the cladding layers so that it guides at least one optical mode. Segmented waveguide 830 is fabricated on the waveguide 840 with a layer of a desired thickness and index $n_3$, it is patterned by removing undesired material into a tapered width that is preferably wider laterally at the interface 832, and into a segmented pattern by removing material in the regions 838. The removal of material is shown as complete, but the removal may extend down to some degree into the core material of waveguide 840, or the removal may be incomplete, leaving some material behind, bridging the segments 836 (not shown). Notice that the optical propagation axis 834 is a determined distance 835 above the substrate 870, in preparation for a second chip to be attached on the empty portion 872 of the substrate as discussed elsewhere and in relation to FIG. 3. As a variation, the waveguide 840 may be fabricated on waveguide 830, in which case, the segments 836 will be embedded into the core material of 840 instead of into the cladding material of 842. The device 800 may be a portion of the devices 300 or 100 or other devices.

As shown, in FIG. 8, the high index waveguide 830 is fabricated from regions 836 which are interspersed with regions 838 (segments) where the high index material has been removed. Provided that the segmentation period (the sum of the widths of a region 836 and an adjacent region 838 along the direction of optical propagation) is comparable or less than the vertical and lateral Rayleigh ranges $$z_o = \pi w_o^2 / \lambda \quad (13)$$

where $z_o$ is the Rayleigh range, $w_o$ is the $1/e^2$ optical beam intensity half width, and $\lambda$ is the vacuum optical wavelength of the mode, the optical mode will propagate as if the waveguide core were continuous (non-segmented) but had a lower index than that of the regions 836. The effective index contrast with the cladding 842 is reduced by the local duty factor $$DF_{seg} = \text{(local length of segment)/(local segmentation period)} \quad (14)$$

of the segmentation. A duty factor of 50%, obtained when the segments and the removed regions are of equal length, will reduce the effective index of the waveguide by a factor of approximately two. By adjusting the parameters of the waveguide appropriately, the desired mode sizes can be obtained with a segmented guide, but additional degrees of freedom are now available to the designer: the duty factor and the period of the segmentation. For example, if the duty factor is 50% in the region near the input of the waveguide, and the thickness of the tantala film used to fabricate the segments 836 is increased by a factor of 1.414 compared to the previous description to 0.11 microns, the waveguide strength and mode sizes in the vertical and transverse dimensions will be approximately the same as described above.

The duty factor may be reduced along the propagation axis 834 of the waveguide 830 by changing the lithographic mask pattern used in fabricating the segmented waveguide 830, aiding in the accomplishment of the taper. The taper required for the non-segmented waveguide described above has a waveguide width at the small end of the waveguide of 0.7 microns. Such a small dimension may be a challenge to fabricate reproducibly. Larger minimum dimensions are preferred. With the use of segmentation, we choose a minimum dimension of 1.0 micron to obtain the same optical effect of the taper, in terms of the variation of the effective index of the optical mode. The waveguide 830 now tapers laterally from a 2 micron width to a 1 micron width at the small end, the length of the segments 836 is kept constant at 1 micron, and the duty factor is varied from 50% to 25% by increasing the length of the removal regions 838 gradually from 1 micron to 4 microns at the small end. Note that many variations of the functional form of the taper of the segmentation are possible, and many others can be useful, including a linear taper of the duty factor, exponential, hyperbolic, sinusoidal, and all the other mathematical forms. Note also that the general segmentation taper includes the possibility of a taper in the period with alternative functional forms, provided that the period continues to obey the constraint of being comparable or less than the Rayleigh ranges. Many variations are also available in the geometry of segmentation, such as the indented geometry of R. Adar, U.S. Pat. No. 5,577,141, Nov. 19, 1996, "Two-dimensional segmentation mode tapering for integrated optic waveguides", multiple superposed layers of variously segmented materials, etc.

The tantala waveguides shown in FIGS. 1, 3, 5, and 8 are preferably fabricated by deposition of a tantala film of the desired thickness after the fabrication of the germania/silica core. The tantala film may then be patterned by RIE after a masking step to define the desired boundaries of the tantala waveguide segments. Several variations are available, but not shown in the figures, including depositing the tantala waveguide after the top cladding has been deposited. In the latter case, the top cladding is patterned and removed down close to the top surface of the germania/silica core wherever the tantala waveguide structure is desired; a uniform deposition of the desired thickness of tantala is then sufficient to create the desired waveguide.

Lensed Waveguide End

FIG. 7 shows an alternative preferred taper embodiment that can provide good coupling efficiency between two dissimilar waveguides. This approach is based on lensing the waveguide end. FIG. 7A shows a substrate 770 prepared with a waveguide core 740 upper cladding 742 and lower cladding 744. The waveguide core 740 has higher index of refraction than the cladding layers so that it guides at least one optical mode. As with the waveguides described elsewhere herein, this waveguide may be called a single mode waveguide if it guides predominantly a single mode. The higher order modes may be cut off, in which case the guide is strictly single mode, or a few poorly confined and higher loss modes may be weakly guided, in which case the guide is effectively single mode which may still be useful for many applications including coupling to single mode optical fibers. A region 752 of the core 740 projects slightly from the surface 732. Although the projection is shown with sharp edges in FIG. 7A, these edges may be rounded.

This projection may be fabricated by applying a two step selective etch. First, the waveguide may be etched vertically by a non selective etching process that etches both the cladding and core layers at similar rates, exposing upper and lower cladding in the region where the core 740 emerges at the surface. In this step an etch barrier such as a metal coating of Au or Cr is deposited onto the surface of the semi-processed article. A patterned layer of photo resist is applied on top of the etch barrier in the desired pattern of the removal region (and other patterns if desired) and etched to transfer the photo resist pattern to the etch barrier. A reactive ion etching process may be used to etch down into the silica layers left exposed by the patterned etch barrier layer. The etch time is preferably controlled to allow an etch depth large enough to etch through the core 740 and into the lower cladding 744. The etch proceeds approximately vertically down towards the substrate 770. Many process alternatives exist to accomplish this etch; the preferred method is to use $CHF_3$ as the reactive gas at a pressure of 20 mTorr. At this stage, the exposed surface of the semi-processed device is flat.

Second, a selective etch may be performed on the surface, that preferentially etches the cladding layers 742 and 744 compared to the core 740. The preferred way to perform this etch is to perform a chemical etch with a buffered HF solution (BHF: a mixture of ammonium fluoride and hydrofluoric acid). As is known in the art, BHF etches silica rapidly, but does not etch $GeO_2$ at all, so that the $GeO_2$-rich core layer 740 etches more slowly than the pure silica cladding layers. The exact profile of the protrusion created by this process follows the concentration profile of Ge. Other means of selective etching may also be used, including dry etching. The distance by which the center of the core projects from the surface 732 depends on the etching parameters (materials, densities, time, temperature, etc.). If there is no upper cladding used for the waveguide 740, i.e. layer 742 is absent (not shown), the shape of the resultant lenticular structure will be different, and asymmetric vertically. As was the case for FIG. 3, a diode laser chip may be aligned and attached to the substrate 770 (preferably by flip-chip bonding) so that the axis of the laser waveguide 320 or 112 is coaxial with the axis 754 of the waveguide 740.

Although for simplicity FIG. 7 shows the core shape being unchanged by the etching process, in reality, the shape of the protrusion 753 in the region of the core 740 at the surface 732 has no sharp corners and can be described by smooth curves as in FIG. 7B, where surface grid lines along the x-z planes and the y-z planes are shown to give an impression of the smoothly varying surface shape. FIG. 7B shows the protrusion 753 forming a lenticular structure with two different curvatures in the x-z and in the y-z planes, since the height (y-dimension) and width (x-dimension) of the core 740 at the surface 732 are different. Different curvatures are desired because the divergences of the diode laser mode are quite different in the two planes due to the different typical mode sizes, as described above. The small vertical mode size leads to strong vertical divergence, so a strong curvature is desired in the y-z plane. Only a weak (or no) horizontal curvature is needed to compensate the horizontal beam divergence. To accommodate this difference, the approximately square cross-section waveguide 740 may be widened as shown in the regions 750 for FIG. 7A and 751 for FIG. 7B. The curvature in the y-z plane may be adjusted through the selective etching conditions, with generally larger etching time producing a larger curvature, all other things being equal. The curvature is preferably adjusted until the vertical divergence of the diode laser beam may be compensated. The curvatures of the protrusion 753 will vary inversely as the widths of the waveguide in the surface 732, so the desired ratio of curvatures (vertical to horizontal) can be obtained by adjusting the ratio of the widths (vertical to horizontal). Since a hyperbolic lens surface has no spherical aberration, the fabrication conditions are preferably adjusted to obtain a near-hyperbolic profile for the protrusion 753 in the region near the axis 754 where the mode profile crosses the surface 732.

In the case of a planar waveguide, the region 740 is very wide laterally compared to its vertical width, it supports a plurality of different axes of propagation in the x-z plane, and the lenticular structure will be translationally invariant along the x axis, providing focusing mainly in the vertical y-z plane. Note also that the surface 732 (ignoring the protrusion) is shown as being locally normal to the axis of propagation 754 of the mode of the waveguide 740. In this case, by the symmetry of the situation, the local surface of the protrusion at the axis 754 is normal to that axis. However, this surface may be inclined at an angle to deviate the beam, or curved to provide lateral focusing, or take on another shape for a different purpose.

In FIG. 7A, the rectangular portion 750 (or 751 of FIG. 7B) of the waveguide is preferably kept smaller in length (along the direction of propagation) than the lateral Rayleigh range so that the optical mode does not have a significant opportunity to expand in the horizontal dimension between the surface 732 and the beginning of the roughly square region 760 of the waveguide 740. If this condition is obeyed, no taper may be needed between the two sections of waveguide 750 and 760. In use of a lensed waveguide coupling section, it may be desirable not to use index matching material. Use of an index matching material has the advantage of reducing the Fresnel reflections, but it has the undesired effect of requiring an increased curvature of the surface 732 which undesirably increases the fabrication time and tightens the manufacturing tolerances.

In an optional step of the fabrication of the lensed surface 753, the region may be heated to a temperature near the softening temperature of the materials 740, 744, and 742. Above the softening temperature but below the melting point, the surface tension of the silica can change the surface profile. This can be called thermal slumping of the surface. By applying a controlled thermal ramp to the wafer, or to an individual part, the temperature may be raised above the softening temperature for a time sufficient to allow a reduction in the curvature of the protrusion to a desired value. This step is of interest if the spatial profile of the protrusion produced by the selective etch step described above is too sharp (as shown in FIG. 7A). Another desirable effect of thermal slumping is the smoothing of the surface, reducing optical scatter. The heating may be accomplished of a single chip, the entire wafer, or of individually selected regions. While an oven can be used for wafer-scale processing, a laser can advantageously be used to heat the region around the protrusion 752 or 753 if it is desired to slump individual regions. Preferably, a $CO_2$ laser may be used to provide an energetic pulse of 10 micron optical radiation that is directed onto the surface 732 and is partly absorbed in a volume near the surface. If an optical pulse is applied so that between about 0.5 to 1 $J/cm^2$ is absorbed within the top few microns of the predominantly silica waveguide material during a period of a few microseconds, thermal slumping will be observed. For longer pulses, more energy will be required, but the thermal diffusion depth varies approximately as the square root of the time, so the required energy increases as the square root of the pulse length above a pulse duration of a few microseconds. By controlling the laser pulse length and energy, (and wavelength), and the number of pulses, the desired degree of slumping can be controlled to approach the desired curvature.

The protrusion 753 may be used to refocus optical radiation. An optical beam is propagated along the waveguide 740 towards the protrusion 753. Provided that the material outside the waveguide and across the interface 732 has a lower index of refraction than the core 740, upon traversing the interface 732, the beam is focussed by the curvature of the interface 732, and acquires a converging characteristic. The higher index central portion of the protrusion retards the phase fronts of the mode as it traverses the interface, causing phase front curvature related to the curvature of the protrusion, and focussing the mode. As the beam continues to propagate towards a longitudinal position of minimum beam size, at least one beam dimension continues to shrink or focus. Another waveguide may be aligned in proximity to this position so that the refocussed beam can enter the second waveguide with good coupling efficiency. If the second waveguide is the active waveguide of a semiconductor laser, the arrangement described may be a part of an injection locking apparatus, an external cavity resonator apparatus, an amplifier apparatus, or other structures.

Alternatively, the protrusion 753 may be used in effectively coupling a second waveguide such as in a semiconductor laser to a waveguide 740. In this case, the optical beam is originated inside the diode laser, propagates to the protrusion where it is refocussed from a diverging beam, and propagates along the axis 754 of the waveguide 740. Again the end of the second waveguide may be aligned relative to the interface 732 such that the emission facet is collocated with the minimum focus, within a tolerance to achieve the desired coupling efficiency. If the second waveguide is fabricated on the same substrate as the waveguide 740, the alignment of the end of the second waveguide is accomplished lithographically. If the second waveguide is a semiconductor diode laser, the alignment of the second waveguide end is accomplished during an attach process between the substrate of the diode laser and the substrate 770.

In a further alternative preferred embodiment, an indentation may be fabricated instead of a protrusion 753. To fabricate the indentation, a selective etch process may be performed that preferentially etches the core layer 740 compared to the cladding layers 742 and 744. The preferred way to perform this etch is to perform a chemical etch with an aqueous solution of $H_2SO_4$. Since the etching rate of $SiO_2$ in this etchant is nil, while the etching rate of $GeO_2$ is medium, a process temperature above room temperature is preferred, such as 30° C. or 50° C. The $GeO_2$-rich core layer 740 etches more rapidly than the pure silica cladding layers. Again, the profile of the indentation created by this process follows the concentration profile of Ge. Now, with air in the removal region, the indentation defocusses the mode passing through the interface, which may be useful for some applications. With an index matching fluid in the removal region that has a higher index of refraction than the waveguide core 740, focusing is again obtained at the indentation. The general description of the structures incorporating the protrusion and the usage of the protrusion also apply to the indentation provided that attention is paid to the reversal of the focusing properties according to the index of refraction of the removal region.

What is claimed is:

1. A grating coupled add-drop device comprising:
    a resonator having a round trip optical path characterized by a round trip optical length defining a free spectral range and a plurality of longitudinal resonator mode frequencies;
    an intracavity waveguide segment disposed along the optical path of said resonator, said intracavity waveguide having an effective refractive index that is substantially independent of a variation in temperature;
    a thermo-optic waveguide segment disposed adjacent said intracavity waveguide, said thermo-optic waveguide having a temperature dependent refractive index;
    a resistive heater electrode characterized by a temperature thermally coupled to said thermo-optic waveguide;
    a grating disposed in overlapping relation with a light beam propagating in said thermo-optic waveguide and inducing a grating coupling between said intracavity and thermo-optic waveguides, wherein a grating frequency of the grating coupling is tuned by the variation in temperature and at least a first resonator mode frequency is substantially independent of the variation in temperature, and
    an external waveguide segment disposed adjacent the optical path of said resonator and optically coupled to said resonator in a broadband parallel coupler arrangement.

2. The device of claim 1 wherein the grating frequency is tuned to substantially coincide with the first resonator mode frequency.

3. The device of claim 1 wherein the free spectral range is a rational fraction of a specified frequency channel spacing within an optical communications frequency band.

4. The device of claim 1 wherein the grating coupling is characterized by a half-width-at-half-maximum coupling bandwidth, and wherein the coupling bandwidth is narrower than the free spectral range.

5. The device of claim 1 wherein a subset of the longitudinal mode frequencies coincide with a plurality of specified communications channels.

6. The device of claim 1 wherein the round trip optical length of said resonator is substantially independent of a uniform variation in temperature of said resonator.

7. The device of claim 1 wherein said intracavity and said thermo-optic waveguides are disposed in parallel coupling relation, said grating is disposed in overlapping relation with light propagating in said intracavity waveguide, and wherein said grating, said intracavity waveguide and said thermo-optic waveguide form a grating assisted parallel coupler.

8. The device of claim 7 wherein the grating coupling is reflective.

9. The device of claim 7 wherein said resonator is a ring resonator characterized by a resonator loss, wherein a first fraction of an optical field in an input waveguide segment of said thermo-optic waveguide is coupled into the first resonator mode, a second fraction of the input field propagates into an optical output and a third fraction of the first resonator mode field is coupled into the optical output, and wherein one of the grating coupling or the resonator loss is adjusted to impedance match said resonator at an impedance matching frequency such that the second and third fractions interfere destructively and an optical power in the optical output is substantially nulled.

10. The device of claim 9 wherein substantially all of an optical power in the input waveguide at the impedance matching frequency is coupled into said resonator.

11. The device of claim 2 wherein said thermo-optic waveguide further comprises:
    an input waveguide segment; and
    an output waveguide segment; and wherein said external waveguide further comprises,
    an add waveguide segment; and
    a drop waveguide segment.

12. The device of claim 11 wherein a substantial fraction of an optical input power in said input waveguide is coupled at the first resonator mode frequency into said drop waveguide and said device is a frequency selective drop device.

13. The device of claim 11 wherein a substantial fraction of an optical input power in said add waveguide is coupled at the first resonator mode frequency into said output waveguide and said device is a frequency selective add device.

14. The device of claim 11 wherein substantially all of an optical input power in said input waveguide at a second resonator mode frequency is coupled into said output waveguide.

15. The device of claim 1 wherein said intracavity waveguide is characterized by a first effective refractive index adjacent said thermo-optic waveguide and said intracavity waveguide further comprises:

an adjusted waveguide segment characterized by an adjusted effective refractive index different from the first effective index.

16. The device of claim 12 further comprising:

an optical detector coupled to receive said substantial fraction of an optical input power, and wherein said device is a frequency selective detector.

17. A grating coupled optical cross connect comprising:

a resonator having a round trip optical path characterized by a round trip optical length defining a free spectral range and a plurality of longitudinal resonator mode frequencies;

a first intracavity waveguide segment disposed along the optical path of the resonator, said first intracavity waveguide having a first effective refractive index that is substantially independent of a first variation in temperature;

a first thermo-optic waveguide segment disposed adjacent said first intracavity waveguide, said first thermo-optic waveguide having a first temperature dependent refractive index;

a first resistive heater electrode characterized by a first temperature disposed adjacent said first thermo-optic waveguide and thermally coupled for heating said first intracavity and thermo-optic waveguides;

a first grating disposed in overlapping relation with light propagating in said first intracavity and thermo-optic waveguides and inducing a first grating coupling between said first intracavity and thermo-optic waveguides, wherein a first grating frequency of the first grating coupling is tuned by the first variation in the first electrode temperature and at least a first resonator mode frequency is substantially independent of the first variation in the first electrode temperature;

a second intracavity waveguide segment disposed along the optical path of the resonator, said second intracavity waveguide having a second effective refractive index that is substantially independent of a second variation in temperature;

a second thermo-optic waveguide segment disposed adjacent said second intracavity waveguide, said second thermo-optic waveguide having a second temperature dependent refractive index;

a second resistive heater electrode characterized by a second temperature disposed adjacent said second thermo-optic waveguide and thermally coupled for heating said second intracavity and thermo-optic waveguides;

a second grating disposed in overlapping relation with light propagating in said second intracavity and thermo-optic waveguides and inducing a second grating coupling between said second intracavity and thermo-optic waveguides, wherein a second grating frequency of the second grating coupling is tuned by the second variation in the second electrode temperature and the first resonator mode frequency is substantially independent of the second variation in the second electrode temperature.

18. The cross connect of claim 17 wherein the free spectral range is a rational fraction of a specified frequency channel spacing within an optical communications frequency band.

19. The cross connect of claim 17 wherein the first and second grating couplings are characterized respectively by a first and a second half-width-at-half-maximum coupling bandwidth, and wherein the first and second coupling bandwidths are narrower than the free spectral range.

20. The cross connect of claim 17 wherein a subset of the longitudinal mode frequencies coincide with a plurality of specified communications channels.

21. The cross connect of claim 17 wherein the first and second grating frequencies are tuned to substantially coincide with the first resonator mode frequency, wherein said first thermo-optic waveguide further comprises:

a first input waveguide segment; and a first output waveguide segment;

and wherein said second thermo-optic waveguide further comprises, a second input waveguide segment; and a second output waveguide segment.

22. The cross connect of claim 21 wherein said resonator is a ring resonator characterized by a resonator loss, wherein a first fraction of an optical field in said first input waveguide is coupled into the first resonator mode, a second fraction of the input field propagates into said first output waveguide and a third fraction of the first resonator mode field is coupled into said first output waveguide, and wherein one of the first grating coupling or the resonator loss is adjusted to impedance match said resonator at the first resonator mode frequency such that the second and third fractions interfere destructively and a first output optical power at the first resonator mode frequency in the first output waveguide is substantially nulled.

23. The cross connect of claim 22 wherein substantially all of a first optical input power at the first resonator mode frequency in said first input waveguide is coupled into said resonator.

24. The cross connect of claim 23 wherein a fourth substantial fraction of the first input power at the first resonator mode frequency is coupled into said second output waveguide.

25. The cross connect of claim 24 wherein a fifth substantial fraction of a second optical input power at the first resonator mode frequency in said second input waveguide is coupled into said first output waveguide.

26. The cross connect of claim 21 wherein substantially all of a first optical input power at a second resonator mode frequency in said first input waveguide is coupled into said first output waveguide.

27. The cross connect of claim 17 wherein said first intracavity waveguide is characterized by a first effective refractive index adjacent said first thermo-optic waveguide and said first intracavity waveguide further comprises:

a first adjusted waveguide segment characterized by a first adjusted effective refractive index different from the first effective index.

* * * * *